(12) United States Patent
Summers et al.

(10) Patent No.: US 12,730,150 B1
(45) Date of Patent: Sep. 8, 2026

(54) LOOPBACK TEST FOR PHASE INTERPOLATOR CODES

(71) Applicant: Cadence Design Systems, Inc., San Jose, CA (US)

(72) Inventors: Mark A. Summers, Cary, NC (US); Benjamin L. Heilmann, Southport, NC (US); Satya Someswara Kaushik Yanamandra, Gaithersburg, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 127 days.

(21) Appl. No.: 18/955,733

(22) Filed: Nov. 21, 2024

(51) Int. Cl.
*G01R 31/317* (2006.01)
*H03L 7/091* (2006.01)

(52) U.S. Cl.
CPC . *G01R 31/31727* (2013.01); *G01R 31/31724* (2013.01); *H03L 7/091* (2013.01)

(58) Field of Classification Search
CPC ........ G01R 31/31727; G01R 31/31724; H03L 7/091
USPC .......................................................... 714/731
See application file for complete search history.

(56) References Cited

U.S. PATENT DOCUMENTS 9,036,764 B1 * 5/2015 Hossain ................ H04L 7/0337 375/376
10,333,533 B1 6/2019 Moscone

* cited by examiner

*Primary Examiner* — Esaw T Abraham
*Assistant Examiner* — Enam Ahmed
(74) *Attorney, Agent, or Firm* — Schwegman Lundberg & Woessner, P.A.

(57) ABSTRACT

Loopback testing of a phase interpolator (PI) in a serial link system. A CDR loop operates in a loopback mode until a sampling clock signal locks to a first valid lock point in a first UI. The CDR loop includes the PI and a phase blender for blending weights of multiple clock signals, phase offset from each other, to apply a blender delay to the sampling clock signal. The PI phase code is stored, and the sampled loopback signal is checked for bit errors. The blender delay is repeatedly adjusted to phase shift the sampling clock signal, locking the sampling clock signal with the CDR loop, and checking for bit errors of the loopback signal, such that the blender delay sweeps across at least one UI. For each further UI, the PI phase code is adjusted to target a further valid lock point, and the blender delay is swept.

20 Claims, 21 Drawing Sheets

LOOPBACK TEST FOR PHASE INTERPOLATOR CODES

TECHNICAL FIELD

The present disclosure relates to integrated circuits and, in particular, to methods and systems for testing phase interpolator codes in serial link systems using loopback testing.

BACKGROUND

Serial link systems enable high-speed data transmission between components in integrated circuits. These systems employ phase interpolators in clock recovery operations to generate precise clock phases from input reference clocks. Phase interpolators produce varying output clock phases and can rotate or step the output clock phase between edges that define a period of the input clock. Testing and validation of these systems commonly involves loopback configurations where transmitted data is routed back to the receiver for verification. The clock and data recovery loops in these systems utilize phase interpolation techniques to maintain proper timing relationships between the transmitted data and sampling clocks.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
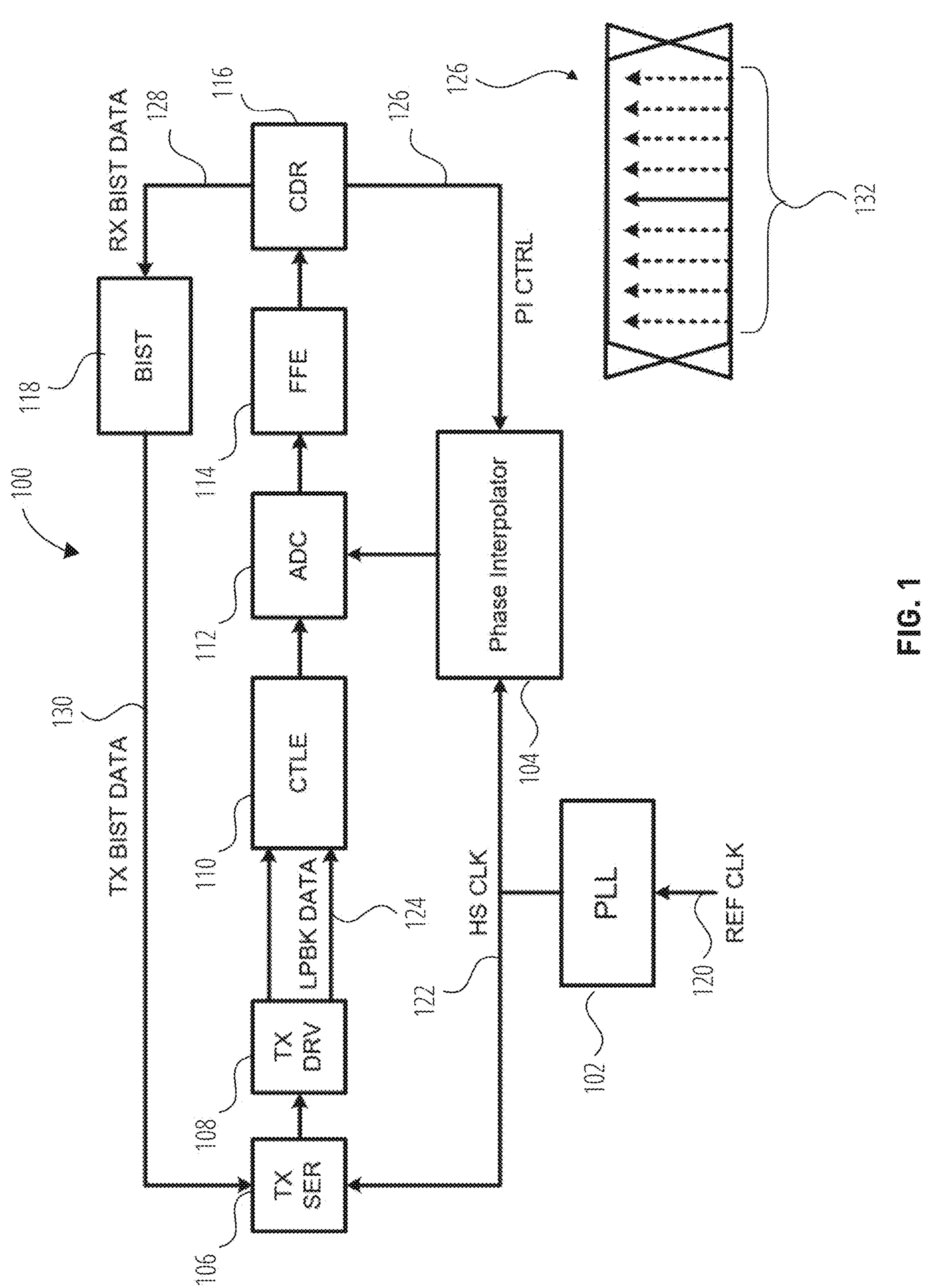
FIG. 1 is a block diagram illustrating a loopback test configuration for a serial link system, according to some examples.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Examples described herein provide techniques for loopback testing of phase interpolator codes in serial link systems.

Serial link systems employ phase interpolators in clock recovery operations to generate precise clock phases from input reference clocks. These systems commonly use loopback testing in which transmitted data is routed back to the receiver for verification. A typical loopback test configuration is described below with reference to FIG. 1, and includes a phase-locked loop (PLL), a phase interpolator, a transmitter serializer, a transmitter driver, a continuous time linear equalizer (CTLE), an analog-to-digital converter (ADC), a feed-forward equalizer (FFE), and a clock and data recovery (CDR) block. The transmitter built-in self-test (BIST) generates test data that is processed through the transmitter path and looped back to the receiver path for verification.

In conventional loopback testing, the phase interpolator output phase typically settles at a small number of phase steps due to the common PLL clock between transmitter and receiver paths. This limited phase coverage can lead to test escapes where defective parts pass testing but fail in field applications when untested phase outputs are required.

The described examples implement a technique to test all phase interpolator codes without requiring additional signal path components. In some examples, this can be achieved through a hybrid phase interpolator architecture that includes phase interpolator mixers and an injection-locked ring stage. An example of such a hybrid phase interpolator is described in U.S. Pat. No. 10,333,533 to Moscone, filed Sep. 18, 2018 and issued Jun. 25, 2019, which is hereby incorporated by reference in its entirety.

In example hybrid phase interpolators described herein, the phase interpolator mixers generate injection signals with inverse step size profiles, while the injection-locked ring averages these profiles to produce output clock phases with constant step sizes. A blending stage follows the phase interpolator, incorporating blending buffers that weight multiple input phases to create output phases. The blending buffers provide adjustable weighting that can be leveraged to move the output phase. In some examples, each blender output signal operates at quarter rate, with phase separation of one unit interval (UI) between phases. Thus, the system generates four output phases spread over four UIs, with each output phase capable of moving approximately 1.5 UIs through blender adjustment. When operating in loopback mode, the CDR can cause the phase steps to dither, such as by 4-5 PI codes; the amount of dither can be adjusted by modifying the bandwidth of the CDR loop.

In some examples, the testing method involves several steps. First, the system operates in loopback mode until the CDR loop locks to a valid lock point in the first UI. The PI phase code is stored, and bit errors are checked. The blender delay is then adjusted to phase shift the loopback signal, followed by CDR loop operation to maintain lock. This process repeats until the blender delay spans at least one UI.

To achieve complete coverage, the system sweeps across multiple UIs by adjusting the PI phase code to target different valid lock points. In some examples, there are four valid lock points, as the PI covers four UIs. At each lock point, the blender delay sweep is repeated. The blender steps are sized to be no greater than the CDR dither range, ensuring comprehensive coverage of PI codes.

In some examples, the architecture of the hybrid PI including the blender can include specific circuit implementations. The phase interpolator mixers can incorporate differential amplifiers with load resistors and digital-to-analog controllers. The injection-locked ring can include multiple delay stages, each contributing a finite delay to establish phase-offset versions of the oscillator signal. The delay stages include differential amplifiers with bias current control and load resistors.

The hybrid PI can be implemented with various modifications. The blending buffers can be configured with different weighting schemes, and the CDR bandwidth can be adjusted to modify the dither range. The number of valid lock points and UI coverage can be adapted based on system requirements.

Some examples described herein can provide one or more advantages to address technical problems and challenges in conventional loopback testing of phase interpolators. The testing methods described herein can utilize existing circuit components without requiring additional signal path hardware. The blending stage's adjustable range can enable comprehensive testing of PI codes while maintaining normal system operation. In some cases, the described examples can be integrated into standard production test procedures without significant modifications to existing test infrastructure. The described examples can be implemented in various integrated circuit applications requiring phase interpolation and clock recovery. In some examples, the testing methods described herein can be applied to high-speed serial link systems where precise phase control and comprehensive validation are required.

FIG. 1 is a block diagram illustrating a loopback test configuration 100 for a serial link system, according to a conventional approach. The loopback test configuration 100 includes a phase-locked loop (PLL) 102 that receives a reference clock signal 120 and generates a high-speed clock signal 122. The PLL 102 provides clock signals to both transmit and receive paths of the system.

A built-in self-test (BIST) circuit, shown as BIST block 118, generates transmitter BIST data 130 that is processed through a transmitter path. The transmitter path includes a transmitter serializer 106 and a transmitter driver 108 that process and transmit the transmitter BIST data 130. The transmitter driver 108 outputs loopback data 124 that is routed to a receiver path.

In some examples, the loopback test configuration 100 may be implemented as an internal loopback within the integrated circuit. In other examples, the loopback test configuration 100 may be implemented as an external loopback connection.

The receiver path includes a continuous time linear equalizer (CTLE) 110 that receives and conditions the loopback data 124. The conditioned signal is provided to an analog-to-digital converter (ADC) 112 that converts the analog signal to digital form. A feed-forward equalizer (FFE) 114 processes the digitized signal to compensate for channel effects. A clock and data recovery (CDR) circuit, shown as CDR block 116, receives the equalized digital signal from the FFE 114.

The CDR block 116 generates PI control signals 126 that control a phase interpolator (PI) 104. The PI 104 generates sampling phases 132 of a sampling clock signal used to sample the received data. The CDR block 116 maintains proper timing relationships between the loopback data 124 and sampling phases 132 by adjusting the PI control signals 126.

The loop encompassing the PI 104, ADC 112, FFE 114, and CDR block 116 can be referred to herein as the CDR loop. In loopback mode, the CDR loop causes the phase interpolator output phase to settle at a small number of phase steps due to the common PLL clock (e.g., high-speed clock signal 122) shared by the transmit and receive paths.

The BIST block 118 compares receiver BIST data 128 recovered from the loopback path against the transmitter BIST data 130 to verify proper system operation. This comparison may detect bit errors that indicate issues with the phase interpolator codes or other system components.

The PI 104 may be implemented as a hybrid phase interpolator that includes phase interpolator mixers and an injection-locked ring stage, such as a hybrid phase interpolator as described below with reference to FIG. 2, FIG. 4, or FIG. 8. The PI 104 generates multiple clock phases using constant step sizes by averaging inverse step size profiles of injection signals.

Figure 2:
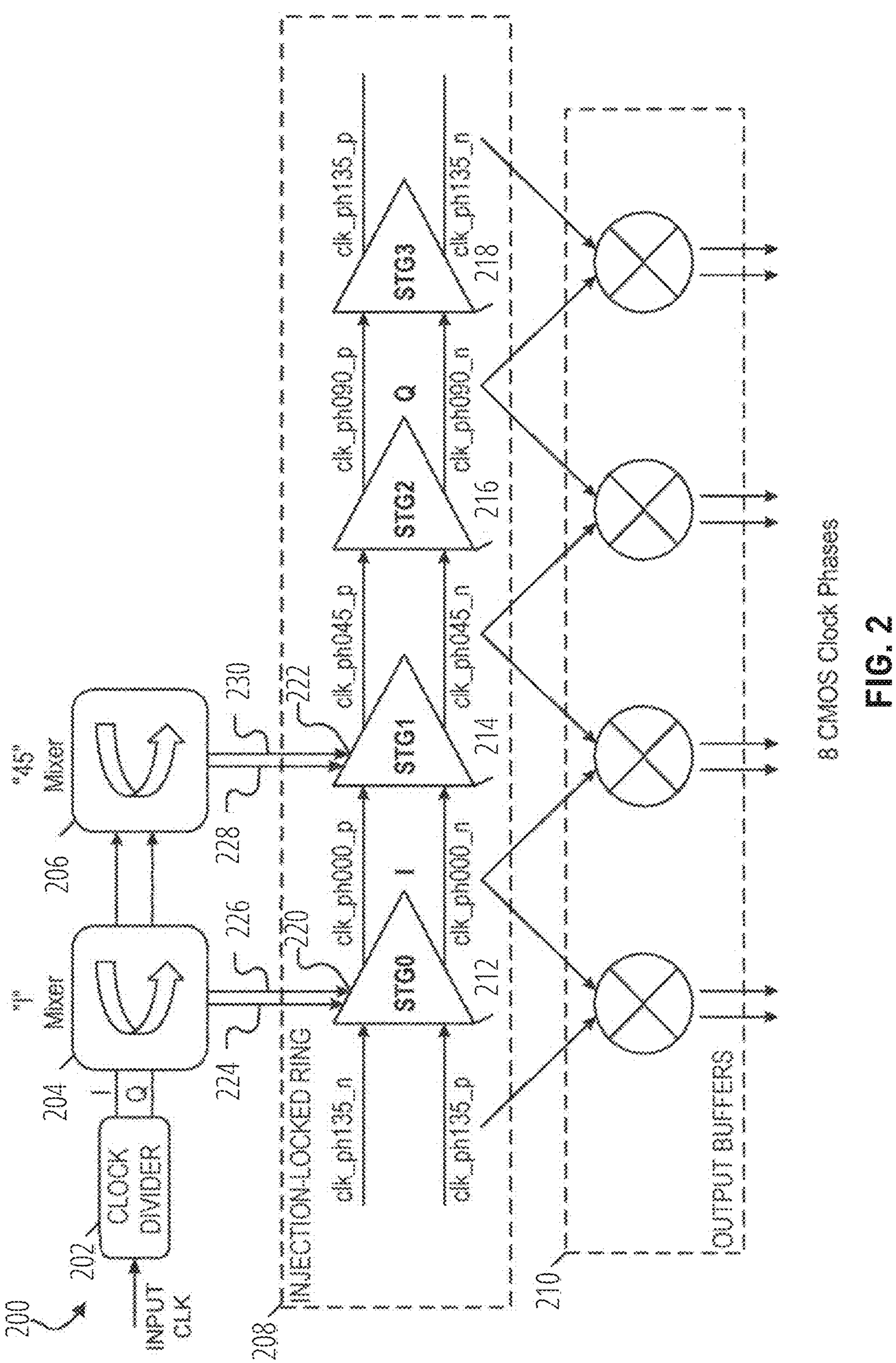
FIG. 2 is a circuit diagram illustrating a hybrid phase interpolator, according to some examples.

With reference to FIG. 2, a hybrid phase interpolator 200 is shown, providing a PI configuration that can be used for loopback self-testing as described herein. As shown, the hybrid phase interpolator 200 comprises a clock divider 202, phase interpolator mixers 204 and 206, an injection-locked ring 208, and output buffers 210. The hybrid phase interpolator 200, and variants and related techniques described below with reference to FIG. 3 through FIG. 7, corresponds to a hybrid PI described in U.S. Pat. No. 10,333,533 to Moscone, filed Sep. 18, 2018 and issued Jun. 25, 2019, which is hereby incorporated by reference in its entirety.

The clock divider 202 receives an input clock signal at its input. The clock divider 202 generates an in-phase (I) clock signal (also referred to herein as the "I clock") and a quadrature (Q) clock signal (also referred to herein as the "Q clock") based on the input clock signal. The I clock corresponds to the input clock signal and the Q clock corresponds to a 90-degree phase shift of the input clock signal. The clock divider 202 provides the I clock at a first output and provides the Q clock at a second output. Although not illustrated in FIG. 2, the clock divider 202 may further generate and provide an inverse I clock (referred to herein as "I clock") and an inverse of the Q clock (referred to herein as "~Q clock").

The outputs of the clock divider 202 are connected to inputs of the phase interpolator mixers 204 and 206 (although the direct connections of the clock divider 202 outputs to the interpolator mixer 206 are not shown for visual simplicity). The phase interpolator mixers 204 and 206 receive the I and Q clocks at their respective inputs. The phase interpolator mixers 204 and 206 use the I and Q clocks to generate injection signals to drive the injection-locked ring 208 based on different combinations of the I and Q clocks. The phase interpolator mixer 204 generates an injection signal 224 by mixing the clock signals according to a 100/0 mixing ratio (e.g., 100% of the I clock and 0% of the Q clock) to produce an injection signal that is in-phase with the I clock. The phase interpolator mixer 204 also generates an injection signal 226 that is the inverse of the injection signal 224 and is thereby in-phase with the ~I clock. The phase interpolator mixer 206 generates an injection signal 228 by mixing the clock signals according to a 50/50 mixing ratio (e.g., 50% of the I clock and 50% of the Q clock) to produce an injection signal that is phase offset with the I clock by 45 degrees. The phase interpolator mixer 206 also generates an injection signal 230 that is an inverse of the injection signal 228.

Figure 3:
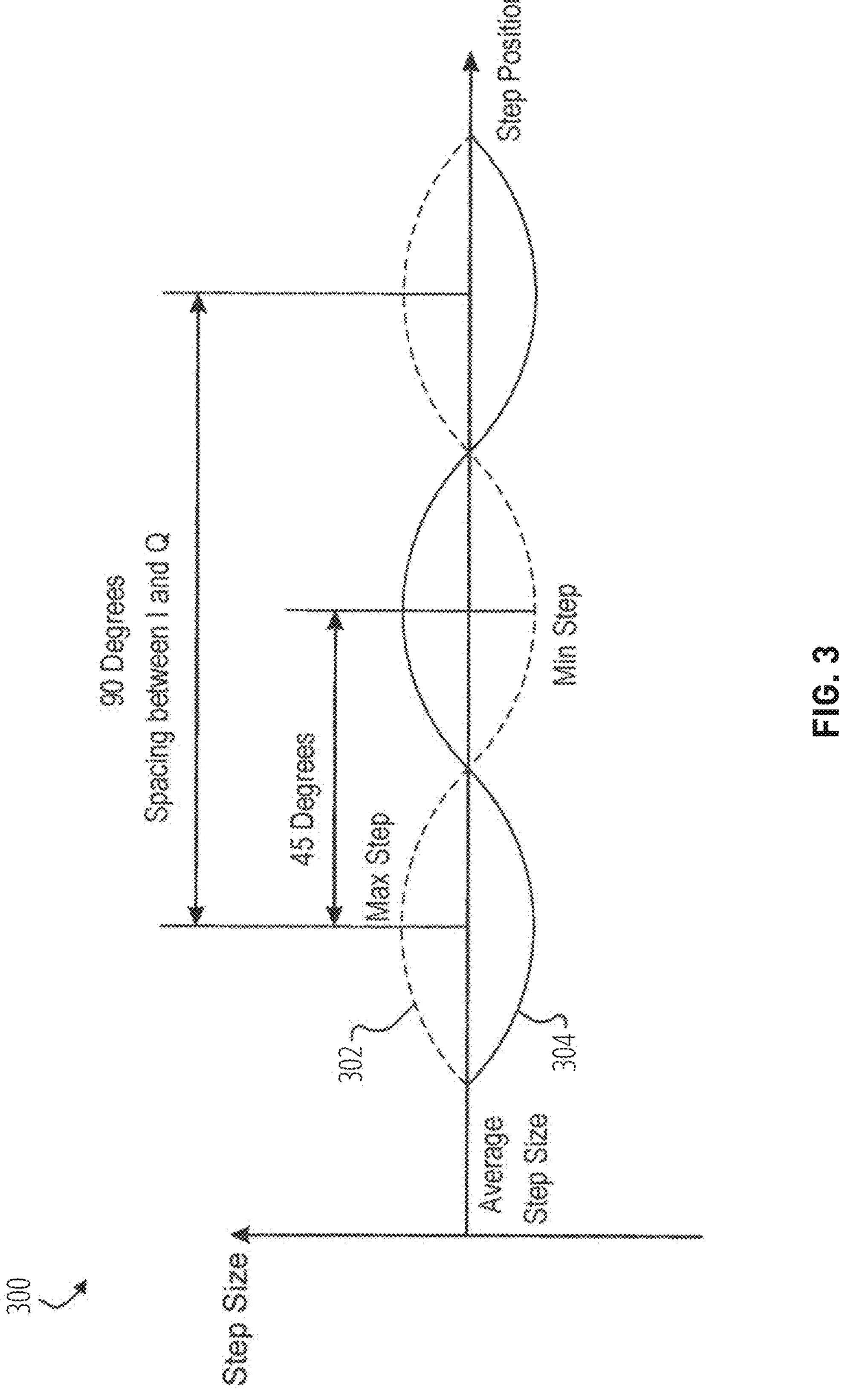
FIG. 3 is a plot illustrating step size curves associated with output signals of two phase interpolator mixer phase interpolators, which are included as part of the hybrid phase interpolators, according to some examples.

The injection signal 224 and injection signal 228 generated by the phase interpolator mixers 204 and 206, respectively, have inverse step size profiles. As a corollary, injection signal 226 and injection signal 230, which are simply the inverses of injection signal 224 and injection signal 228, also have inverse step size profiles. As used herein, a "step size profile" is a characteristic of an injection signal that describes a relationship between step size and phase position. As an example, FIG. 3 illustrates step size profiles of the injection signals output by the phase interpolator mixers 204 and 206. More specifically, in FIG. 3, a graph 300 of step size versus phase position is illustrated. Step size curves 302 and 304 are plotted within the graph 300. Step size curve 302 represents the step size profile of the injection signal 224 output by the phase interpolator mixer 204 and step size curve 304 represents the step size profile of the injection signal 228 output by the phase interpolator mixer 206. As shown, the step size curve 302 is an inverse of the step size curve 304. That is, the relationship between step size and phase position in the injection signal 224 is the inverse of the relationship between step size and phase position in the injection signal 228.

Returning to FIG. 2, the phase injection signal 224 and injection signal 226 provide the injection signals at their respective outputs. The outputs of the phase interpolator mixers 204 and 206 are connected to injection points of the injection-locked ring 208, and the injection-locked ring 208 generates output clock phases based on the injection signals provided by the phase interpolator mixers 204 and 206. By properly combining offset phase step curves in the phase interpolator mixers 204 and 206 with phase averaging provided by an injection-locked ring 208, a first order DNL and INL correction is achieved in the output clock phases. Rotational IQ skew errors generated by the phase interpolator mixers 204 and 206 are largely corrected in the injection-locked ring 208.

The injection-locked ring 208 comprises multiple delay stages. As shown, the injection-locked ring 208 comprises delay stages 212 to 218. Each of the delay stages 212 to 218 comprises at least one injection point.

The injection-locked ring 208 generates a characteristic oscillator signal. Each of the delay stages 212 to 218 contributes a finite delay, such that a time-delayed, or phase offset, version of the oscillator signal is established after each delay stage. Each of the delay stages 212 to 218 is of identical structure and configuration. Therefore, each of the delay stages 212 to 218 applies the same finite delay. The number of delay stages determines the amount of phase shift of each stage.

The oscillator signal undergoes a half cycle (0°-180°) total phase shift as it effectively 'travels' through the intervening delay stages in the first half of the injection-locked ring loop (e.g., clock signals Clk_0_p, Clk_45_p, Clk_90_p, Clk_135_p). Similarly, the oscillator signal undergoes the remaining half cycle of phase shift (180°-360°) as it effectively 'travels' the other half of the injection-locked ring loop (e.g., clock signals Clk_0_n, Clk_45_n, Clk_90_n, Clk_135_n). Thus, each half cycle is divided by n stage-to-stage phase shifts, or by a phase shift of 180°/n. Therefore, because four delay stages are employed, each delay stage would contribute a predetermined phase difference of 180°/4 or 45°.

As shown, the output of phase interpolator mixer 204 is connected to injection point 220 of the delay stage 212 and the output of phase interpolator mixer 206 is connected to injection point 222 of the delay stage 214. Accordingly, the injection signal 224 and injection signal 226 are injected into the injection point 220 of the delay stage 212, and the injection signal 228 and injection signal 230 are injected into the injection point 222.

The injection of the injection signal 224 and injection signal 226 to the injection point 220 causes the generated oscillator signal of the injection-locked loop to lock in both frequency and phase with the injection signal 224 and injection signal 226. Injection locking generally occurs when an oscillator operating at a certain frequency (e.g., the injection-locked ring 208) is disturbed by a second oscillator operating at a different but very close frequency (e.g., the injection signal 224 and injection signal 226) such that the coupling effects yield a locking of the first oscillator to the second oscillator. If the frequencies are sufficiently close and the coupling sufficiently strong, such injection locking will consistently occur in much the same manner that the vibrating strings of two instruments will eventually synchronize in vibration frequency if they are similarly tuned and drawn close enough together.

Because the injection signal 224 and injection signal 226 are injected at the delay stage 212, the injection-locked version of the oscillator signal resulting at the delay stage 212 is in-phase with the injection signal 224 and injection signal 226. Accordingly, after the first delay stage 212, the oscillator signal at the first half of the loop (i.e., Clk_0_p) and the other half of the loop (i.e., Clk_0_n) is not delayed with respect to the injection signal 224 and injection signal 226. Further, the injection-locked versions of the oscillator signal after the other delay stages would be accordingly referenced in phase to the first delay stage 212. For example, after the second delay stage 214, the oscillator signal at the first half of the loop (i.e., Clk_45_p) and the other half of the loop (i.e., Clk_45_n) is delayed by 45°. Similarly, after the third delay stage 216 and fourth delay stage 218, the oscillator signal is delayed by 900 and 135°, respectively.

At injection point 220, as the phase interpolator mixer 204 rotates, large phase steps eventually turn into smaller steps. Correspondingly at injection point 222, as the phase interpolator mixer 206 rotates, small phase steps eventually turn into larger steps because, as noted above, the step size profile of the injection signal provided by the phase interpolator mixer 206 is the inverse of the step size profile of the injection signal provided the phase interpolator mixer 204. The injection-locked ring 208 rotates in such a manner that its instantaneous phase rotation value is equal to the average value of the two steps applied to the injection points 220 and 222, thereby producing the first-order step size correction, and corresponding INL improvement in the output clock phases generated by the injection-locked ring 208.

The injection-locked ring 208 is configured to be a phase-follower only; it does not inherently rotate. By not inherently rotating, the injection-locked ring 208 does not add any DNL, INL, or interphase skew errors back into the output clock phases.

The injection-locked ring 208 provides the output clock phases at its outputs. The outputs of the injection-locked ring 208 are connected to inputs of the output buffers 210. The output buffers 210 provide a second stage of skew correction through utilization of one or more blending techniques. The output buffers 210 further convert the output clock phases generated by the injection-locked ring 208 to complementary metal-oxide-semiconductor (CMOS) clock phases.

Figure 4:
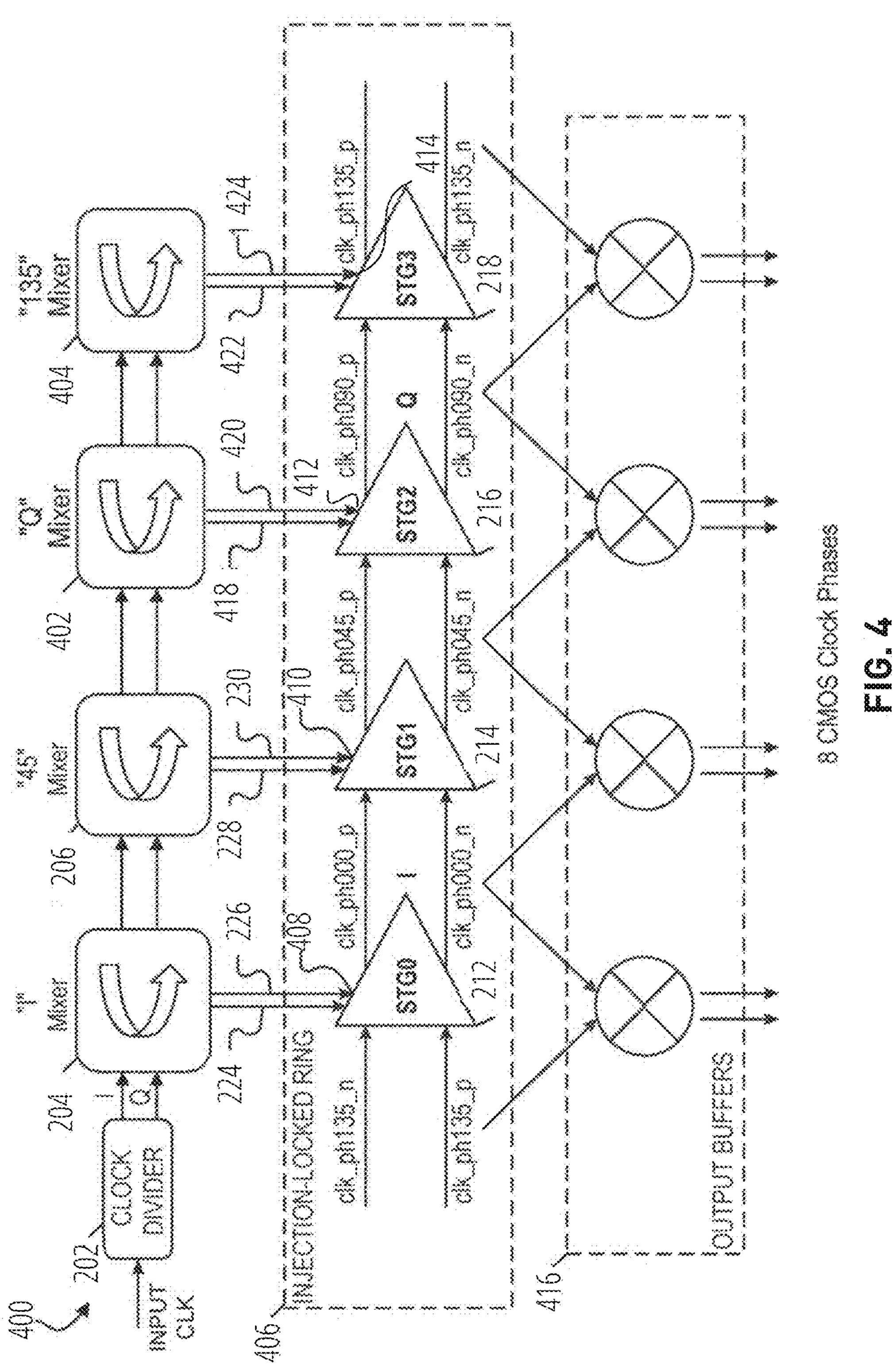
FIG. 4 is a circuit diagram illustrating a hybrid phase interpolator, according to some examples.

As shown in FIG. 4, a variant hybrid phase interpolator 400 of the hybrid phase interpolator 200 of FIG. 2 may, in some embodiments, further include phase interpolator mixers 402 and 404. As with the phase interpolator mixers 204 and 206, the phase interpolator mixers 402 and 404 receive the I and Q clocks at their respective inputs and use the I and Q clocks to generate injection signals to drive the injection-locked ring 406 based on different combinations of the I and Q clocks. In particular, the phase interpolator mixer 402 generates an injection signal 418 by mixing the clock signals according to a 0/100 mixing ratio (e.g., 0% of the I clock and 100% of the Q clock) to produce an injection signal that is in-phase with the Q clock, which as noted above, is in quadrature with the I clock. The phase interpolator mixer 402 also generates an injection signal 420 that is the inverse of the injection signal 418 and is thereby in-phase with the ~Q clock. The phase interpolator mixer 404 generates an injection signal 422 by mixing the clock signals according to a 50/50 mixing ratio (e.g., 50% of the I clock and 50% of the Q clock) to produce an injection signal that is phase offset with the Q clock by 45 degrees and thus phase offset with the I clock by 135 degrees. The phase interpolator mixer 404 also generates an injection signal 424 that is the inverse of the injection signal 422. As with the injection signal 224 and injection signal 228, the injection signal 418 and injection signal 422 have inverse step profiles.

As shown, the phase interpolator mixers 402 and 404 provide the injection signals at their respective outputs. The outputs of the phase interpolator mixers 402 and 404 are connected to injection points of the injection-locked ring 406. In particular, the outputs of interpolator mixer 402 are connected to the injection point of delay stage 216 and the outputs of phase interpolator mixer 404 are connected to the injection point of delay stage 218. Accordingly, the injection signal 418 and injection signal 420 are injected into the injection point of the delay stage 216, and the injection signal 422 and injection signal 424 are injected into the injection point of the delay stage 218. The injection-locked ring 406 generates output clock phases based on the injection signals provided by the phase interpolator mixers 204 to 404 in the same manner as described above with reference to FIG. 2.

Figure 5A:
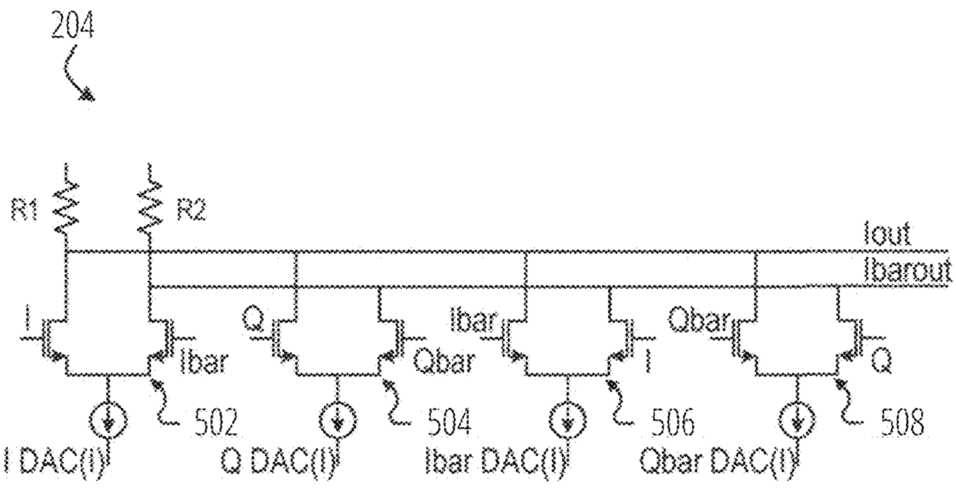
FIG. 5A and FIG. 5B are circuit diagrams illustrating phase interpolator mixers, which are provided as part of the hybrid phase interpolator, according to some examples.

FIG. 5A is a circuit diagram illustrating the phase interpolator mixer 204 included in the hybrid phase interpolator 200. As illustrated in FIG. 5A, the phase interpolator mixer 204 includes differential amplifier 502 to 508 and load resistors R1 and R2. Differential amplifier 502 includes first and second n-channel metal-oxide-semiconductor (NMOS) transistors. As shown, the source nodes of the first and second NMOS transistors are connected to a digital-to-analog controller (DAC) for the I clock. Further, the drain nodes of the first and second NMOS transistors are connected to the resistors R1 and R2. In addition, the first NMOS transistor (e.g., left transistor) receives the I clock at its gate node and the second NMOS transistor (e.g., right transistor) receives an ˜ I clock at its gate node. In an embodiment, resistors R1 and R2 are of equal resistance.

In some embodiments, differential amplifiers 504 to 508 are similar in structure to differential amplifier 502. However, as illustrated in FIG. 5A, (i) the first and second NMOS transistors receive different clocks at their respective gate nodes and (ii) the source nodes of the respective first and second NMOS transistors are connected to different DACs. For example, with regard to the differential amplifier 504. (i) the source nodes of the first and second NMOS transistors are connected to a DAC associated with the Q clock and (ii) the first NMOS transistor receives a Q clock at its gate node and the second NMOS transistor receives a ˜ Q clock at its gate node. Further, with regard to the differential amplifier 506, (i) the source nodes of the first and second NMOS transistors are connected to a DAC associated with the ˜ I clock and (ii) the first NMOS transistor receives an ˜ I clock at its gate node and the second NMOS transistor receives an I clock at its gate node. Lastly, with regard to the differential amplifier 508, (i) the source nodes of the first and second NMOS transistors are connected to a DAC associated with the ˜ Q clock and (ii) the first NMOS transistor receives a ˜ Q clock at its gate node and the second NMOS transistor receives a Q clock at its gate node.

The drain node of the first NMOS transistor of the differential amplifier 502 is connected to the drain node of the first NMOS transistor of each of the differential amplifiers 504 to 508. Similarly, the drain node of the second NMOS transistor of the differential amplifier 502 is connected to the drain node of the second NMOS transistor of each of differential amplifier 504 to 508.

Output injection signals (e.g., the injection signal 224 and an inverse of the injection signal 224) are interpolated between the clocks received at the first and second NMOS transistors of each of the differential amplifiers 502 to 508. Specifically, the interpolator mixer 204 generates the injection signals based on the currents at the I, ˜ I, Q, and ˜ Q DACs. Accordingly, the output injection signals can be positioned anywhere within a 1-clock-period interval (which may correspond to 2 data bits in a half-rate system, or 4 data bits in a quarter-rate system).

Further, only two adjacent differential amplifiers are ever on at once: (i) differential amplifier 502 and 504 or (ii) differential amplifier 504 and 506 or (iii) differential amplifiers 506 and 508 or (iv) differential amplifier 508 and 502. Therefore, because the input clocks between differential amplifiers are in quadrature, the output injection signals will also be in quadrature. For example, if the I DAC current (i.e., differential amplifier 502) is nonzero but the Q DAC current (i.e., differential amplifier 504) is zero, then the injection signal 224 will be aligned with the I input clock. Similarly, if the I DAC current is zero but the Q DAC current is nonzero, then the injection signal 224 will be aligned with the Q input clock. However, if (i) the I DAC current is equal to the Q DAC current, then the injection signal 224 will be phase-aligned half-way between the I and Q input clocks. In other words, as the 1 DAC current is gradually decreased and the Q DAC current is gradually increased, that phase of the injection signal moves from being aligned with the I input clock towards being aligned with the Q input clock. In this manner, the phase interpolator mixer 204 generates a new "interpolated" output clock as the injection signal 224. Further, as mentioned previously above, the inverse of the injection signal 224 will include the same phase as the injection signal 224 but will be of opposite polarity.

Figure 5B:
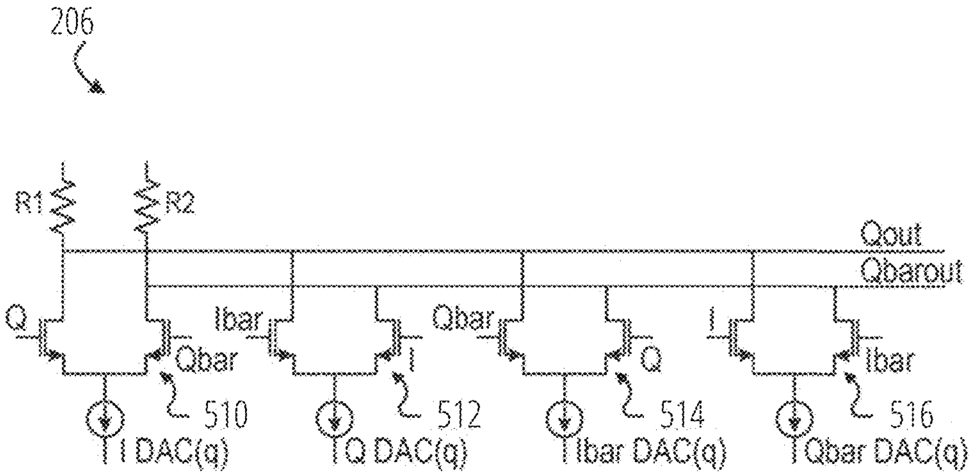

FIG. 5B is a circuit diagram illustrating the phase interpolator mixer 206 included in the hybrid phase interpolator 200. The phase interpolator mixer 206 is similar in structure to the phase interpolator mixer 204 except that the differential amplifiers 510 to 516 receive different input clocks than the differential amplifiers 502 to 508. For example, with regard to the differential amplifier 510, the first NMOS transistor receives a Q clock at its gate node and the second NMOS transistor receives a ˜ Q clock at its gate node. Further, with regard to the differential amplifier 512, the first NMOS transistor receives an ˜ I clock at its gate node and the second NMOS transistor receives an I clock at its gate node. Further, with regard to the differential amplifier 514, the first NMOS transistor receives a ˜ Q clock at its gate node and the second NMOS transistor receives a Q clock at its gate node. Lastly, with regard to the differential amplifier 516, the first NMOS transistor receives an I clock at its gate node and the second NMOS transistor receives an ˜ I clock at its gate node.

Figure 6:
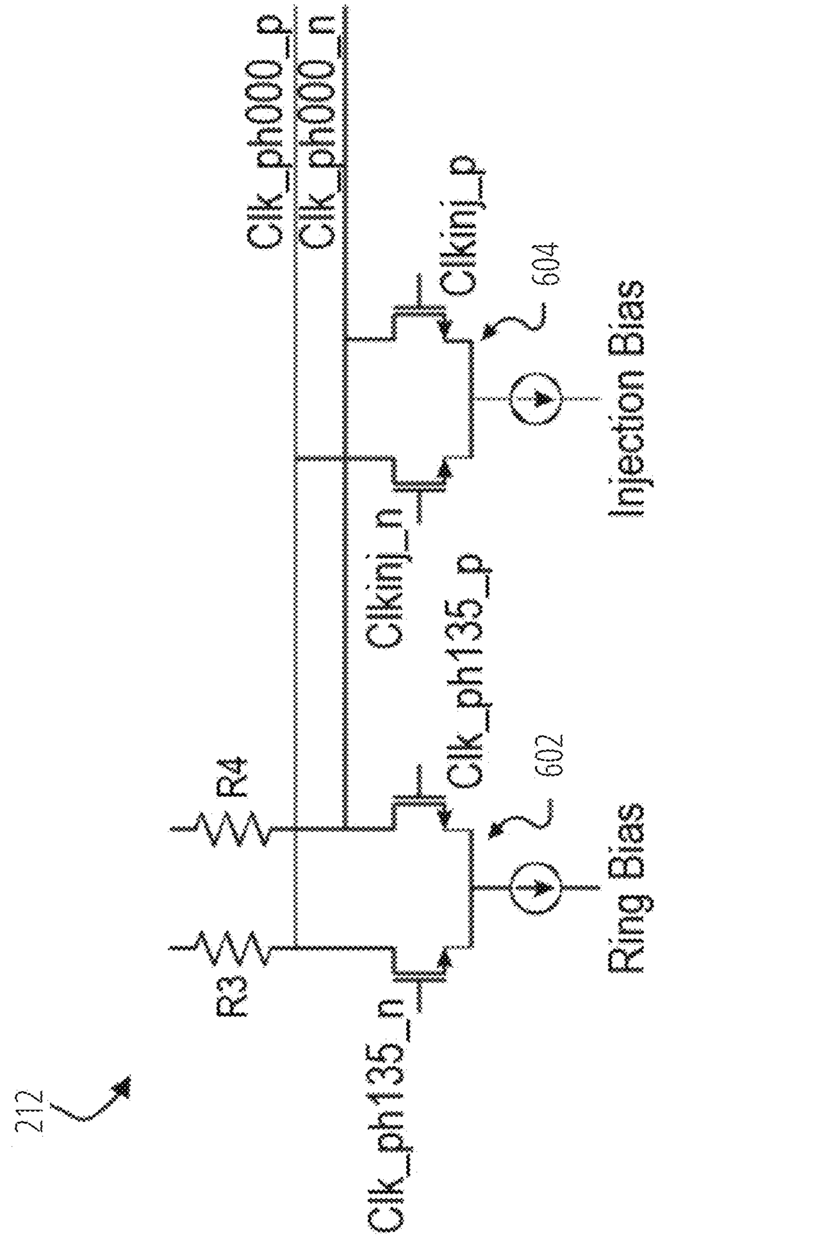
FIG. 6 is a circuit diagram illustrating a delay stage of an injection-lock ring, which is provided as part of the hybrid phase interpolator, according to some examples.

FIG. 6 is a circuit diagram illustrating a delay stage of the injection-locked ring 208, which is provided as part of the hybrid phase interpolator 200. Specifically, FIG. 6 depicts the first delay stage 212. The first delay stage 212 includes differential amplifiers 602 and 604 and load resistors R3 and R4. In some embodiments, resistors R3 and R4 are of equal resistance. In an embodiment, differential amplifier 602 includes first and second NMOS transistors.

As further illustrated in FIG. 6, the source nodes of the first and second NMOS transistors are connected to a bias current for the injection-locked ring 208. Further, the drain nodes of the first and second NMOS transistors are connected to the resistors R3 and R4. In addition, the first NMOS transistor (e.g., left transistor) receives clock signal Clk_135_n at its gate node and the second NMOS transistor (e.g., right transistor) receives clock signal Clk_135_p at its gate node. In an embodiment, with regard to the differential amplifier 604, (i) the source nodes of the first and second NMOS transistors are connected to an injection bias current and (ii) the first NMOS transistor receives an inverse of the injection signal 224 (e.g., ˜ I clock) at its gate node and the second NMOS transistor receives the injection signal 224 (e.g., I clock) at its gate node.

Further. (i) the drain node of the first NMOS transistor of the differential amplifier 602 is connected to the drain node of the first NMOS transistor of the differential amplifier 602 and (ii) the drain node of the second NMOS transistor of the differential amplifier 602 is connected to the drain node of the second NMOS transistor of the differential amplifier 604. In an embodiment, the first delay stage 212 is able to lock the clock signals Clk_0_p and Clk_0_n to the injection signals (i.e., the injection signal 224 and the inverse of the injection signal 224) based on the ring and injection bias currents.

The ring oscillator's bias current is typically calibrated along with the value of the load resistors (i.e., R3 and R4) through a digital calibration loop at startup, so as to force the ring oscillator to have a natural oscillation frequency which is as close to the injection frequency as possible. This places the ring oscillator, when injection-locked, within the center of its lock range. If the injection signal frequency is increased (or decreased) beyond a certain value, above or below this calibrated natural ring oscillation frequency, then the loop will lose lock since the ring oscillator is trying to naturally oscillate at a point which is too far away from the driving injection frequency. The ring's natural oscillation frequency depends on the load resistance and capacitance at the output of each delay stage.

Further, the ring oscillator's voltage swing and loop gain depends partly on the bias current and load resistor values. The injection bias current is typically some fraction of the calibrated ring oscillator bias, having sufficient strength to allow the injection differential pair (e.g., 500) to "pull" the ring oscillator stage into phase alignment with the injection signals (i.e., the injection signal 224 and the inverse of the injection signal 224). The injection bias must be strong enough to allow the injection signal to lock the ring oscillator (stronger injection biases help maximize the lock range). For example, the ring bias may range anywhere from several hundred microamps (e.g., for a 500 MHz natural frequency) to several milliamps (e.g., for a 5 GHz to 10 GHz natural frequency). Further, a typical value for the injection bias would be one-quarter of the respective ring bias. Consistent with some embodiments, the other delay stages 214 to 218 include circuit structures essentially identical to the delay stage 212. However, the other delay stages do not receive the same injection signals as the delay stage 212. For example, as noted above, the delay stage 214 receives the injection signal 226.

Figure 7:
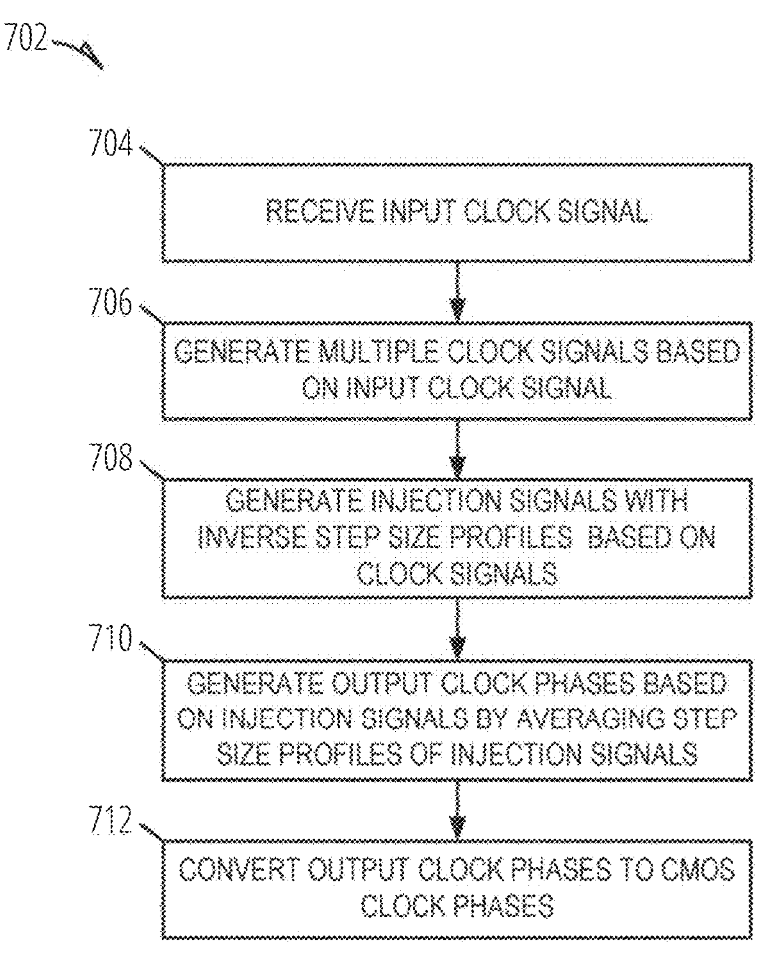
FIG. 7 is a flow diagram illustrating operations of the hybrid phase interpolator in performing a method for generating multiple clock phases using constant step sizes, according to some examples.

FIG. 7 is a flow diagram illustrating operations of the hybrid phase interpolator 200 in performing a method 702 for generating multiple clock phases using constant step sizes. At operation 704, the clock divider 202 receives an input clock signal. The input clock signal may be generated by a clock generator.

At operation 706, the clock divider 202 generates at least two clock signals based on the input clock signal. For example, the clock divider may generate a first clock signal that is in-phase with the input clock signal (e.g., the I clock), and a second clock signal that is phase offset with the input clock signal by 90 degrees (e.g., the Q clock). In light of the phase shift, the first and second clock signal are in quadrature with one another. The clock divider may further generate a third clock signal that is an inverse of the first clock signal (e.g., the ~I clock), and a fourth clock signal that is an inverse of the second clock signal (e.g., the ~Q clock).

At operation 708, the phase interpolator mixers 204 to 404 generate injection signals based on the first and second clock signal generated by the clock divider 202. In generating the injection signals, the phase interpolator mixer 204 generates a first injection signal (e.g., injection signal 224) that is in-phase with the first clock signal. The phase interpolator mixer 204 generates the injection signal 224 by combining the first and second clock signal according to a first combination. For example, the phase interpolator mixer 204 may generate the injection signal 224 by combining the first and second clock signals at a 100/0 mixing ratio (e.g., 100% first clock signal and 0% second clock signal).

The phase interpolator mixer 206 generates a second injection signal (e.g., injection signal 228) that corresponds to a phase shift of the first clock signal (e.g., a 45-degree phase shift). The phase interpolator mixer 206 generates the second injection signal by combining the first and second clock signal according to a second combination. For example, the phase interpolator mixer 206 may generate the second injection signal 228 that corresponds to a 45-degree phase shift of the first clock signal by combining the first and second clock signals at a 50/50 mixing ratio (e.g., 50% first clock signal and 50% second clock signal). By generating the injection signals in this manner, the first and second injection signals 224 and 228 have a 45-degree phase difference.

In addition, by generating the first and second injection signals 224 and 228 in this manner, the first injection signal 224 and the second injection signal 228 have inverse step size profiles. As noted above, the step size profile describes a relationship between step size and phase position. Thus, the relationship between step size and phase position in the first injection signal is the inverse of the relationship between step size and phase position in the second injection signal.

Consistent with some embodiments, the phase interpolator mixer 204 may further generate a third injection signal (e.g., injection signal 226) that is an inverse of the first injection signal, and the phase interpolator mixer 206 may further generate a fourth injection signal (e.g., injection signal 230) that is an inverse of the second injection signal.

At operation 710, the injection-locked ring 208 generates output clock phases based on the injection signals. In generating the output clock phases, the injection-locked ring 208 averages the step size profiles of the injection signals. As noted above, the first and second injection signals have inverse step size profiles. Thus, by averaging the inverse step size profiles, the injection-locked ring 208 generates output clock phases using constant step sizes. The output clock phases may include at least a first and second output clock phase that are offset by 45 degrees. The output clock phases further include: a third output clock phase that is offset with first output clock phase by 90 degrees; a fourth output clock phase that is offset with the first output clock phase by 135 degrees; a fifth output clock phase that is offset with the first output clock phase by 180 degrees; a sixth output clock phase that is offset with the first output clock phase by 225 degrees; a seventh output clock phase that is offset with the first output clock phase by 270 degrees; and an eighth output clock phase that is offset with the first output clock phase by 315 degrees.

At operation 712, the output buffers 210 convert the output clock phases to complementary metal-oxide-semiconductor (CMOS) clock phases. In converting the output clock phases, the output buffers 210 may utilize blending techniques to reduce static and rotating skews in the CMOS clock phases.

Figure 8:
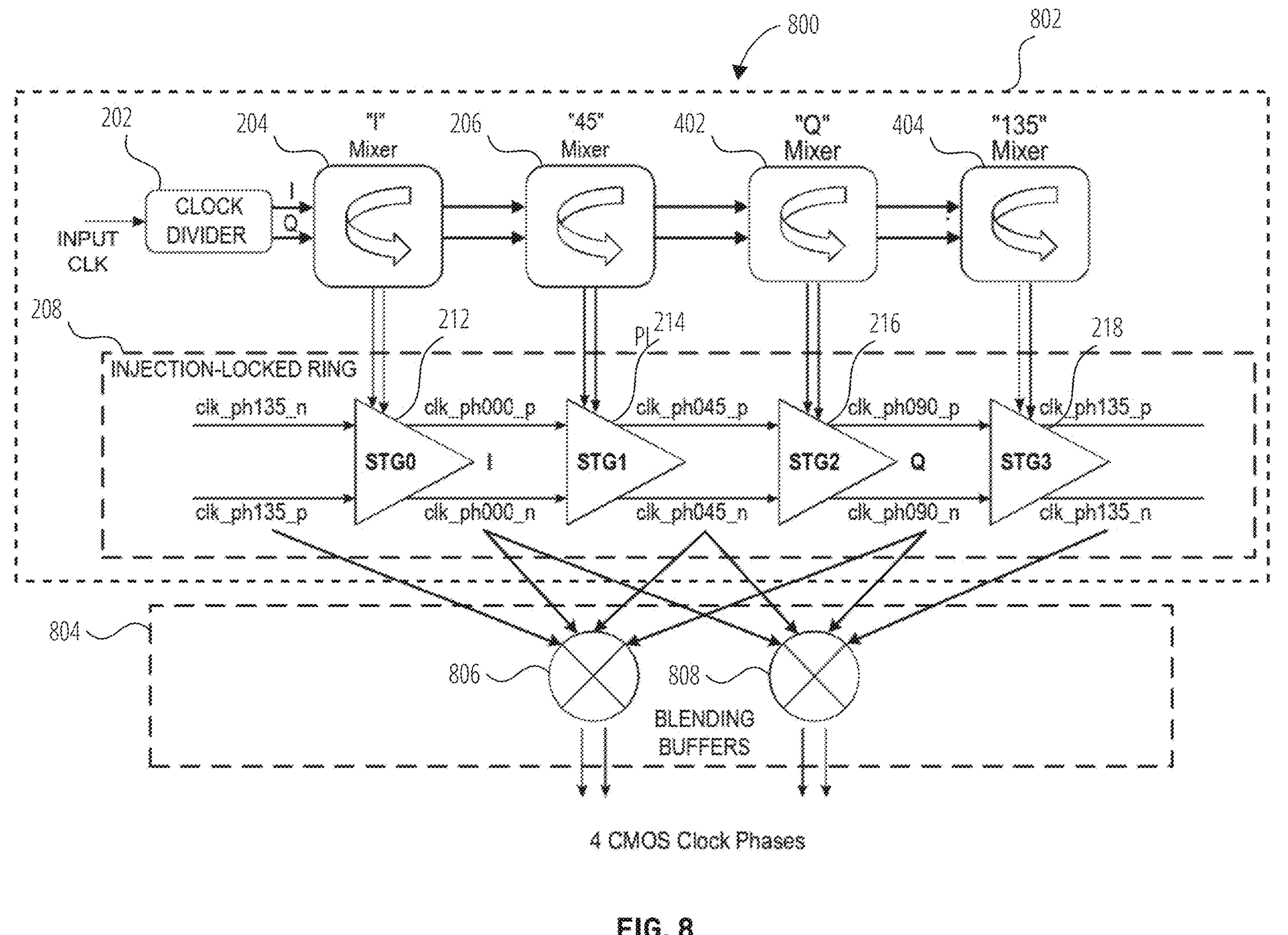
FIG. 8 is a block diagram illustrating a blending hybrid phase interpolator with blending buffers, according to some examples.

FIG. 8 is a block diagram illustrating a blending hybrid phase interpolator 800 with blending buffers 806 and 808. The blending hybrid phase interpolator 800 is a further variant of the hybrid phase interpolator 400 of FIG. 4.

As in the hybrid phase interpolator 200 and hybrid phase interpolator 400, the blending hybrid phase interpolator 800 includes a clock divider 202 that receives an input clock signal. The clock divider 202 generates multiple clock signals including in-phase (I) and quadrature (Q) clock signals based on the input clock signal. In some examples, the clock divider 202 may further generate inverse I clock and inverse Q clock signals.

As in the hybrid phase interpolator 400, the blending hybrid phase interpolator 800 includes multiple phase interpolator mixers (204, 206, 402, 404) that receive the clock signals from the clock divider 202. Each phase interpolator mixer generates injection signals based on different combinations of the I and Q clocks. For example, the phase interpolator mixer 204 generates injection signals by mixing clock signals according to a 100/0 mixing ratio to produce an in-phase signal, while interpolator mixer 206 uses a 50/50 mixing ratio to produce a 45-degree phase shifted signal.

As in the hybrid phase interpolator 400, an injection-locked ring 208 receives the injection signals from the phase interpolator mixers. The injection-locked ring 208 comprises multiple delay stages (212, 214, 216, 218) that each contribute a finite delay. Each delay stage includes at least one injection point for receiving the injection signals. The injection-locked ring 208 generates output clock phases based on averaging the step size profiles of the injection signals.

A blender 804 processes the output clock phases from the injection-locked ring 208. The blender 804 includes blending buffers 806 and 808 that weight multiple input phases to create output phases. The blending buffers provide adjustable weighting that enables phase movement at the output. The blending buffers 806 and 808 generate four CMOS clock phases at their outputs. These CMOS clock signals are the output of the blending hybrid phase interpolator 800 and can be used to sample data signals. The clock signals output by the blending hybrid phase interpolator 800 may be referred to as output clock signals or sampling clock signals.

In some examples, the blending buffers 806 and 808 may provide a blending range enabling the blender delay values to span at least 1.5 unit intervals of input data or loopback data. The blending operation reduces static and rotating skews in the output clock phases.

Collectively, the components from the clock divider 202 through the injection-locked ring 208 are referred to herein as the PI 802 or PI block. The blending buffer 806 and blending buffer 808 are referred to as the blender 804 or blender block.

The architecture of the blending hybrid phase interpolator 800 can enable testing of phase interpolator codes by allowing adjustment of both the PI codes (through the PI 802) and the blender delay (through the blender 804). The blender steps may be sized to be no greater than a dither range of a clock and data recovery loop that controls the phase interpolator. The combination of PI code and blender delay adjustments can be used to perform the loopback self-test techniques described herein.

Figure 9:
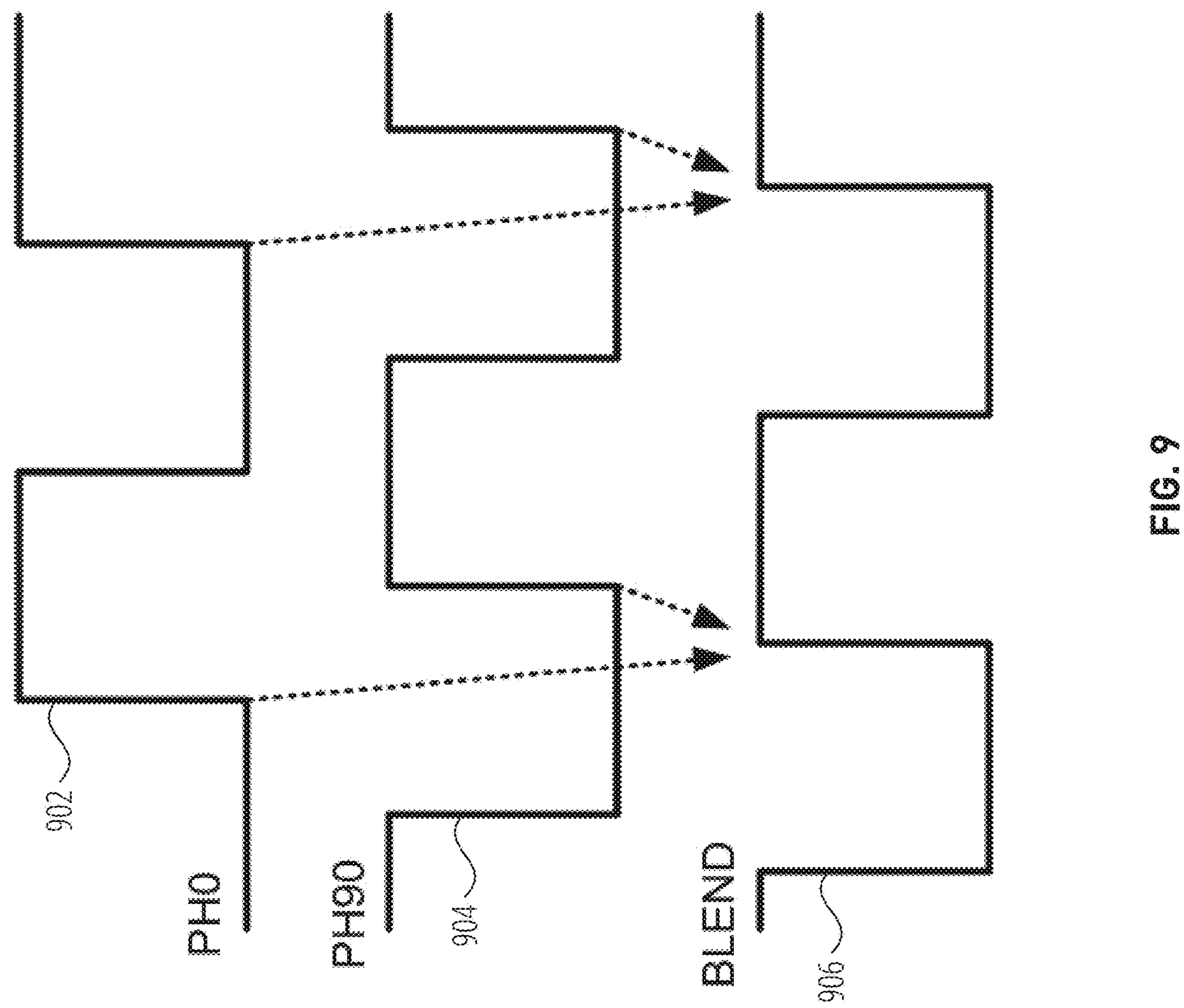
FIG. 9 is a timing diagram illustrating phase blending of clock signals, according to some examples.

FIG. 9 is a timing diagram illustrating phase blending of clock signals. The timing diagram shows three signals: a PHO signal 902, a PH90 signal 904, and a blended signal 906. The PHO signal 902 and PH90 signal 904 represent input clock phases that are offset by 90 degrees. The blended signal 906 represents an output generated by weighting and combining the PHO signal 902 and PH90 signal 904, for example, using the blender 804 of the blending hybrid phase interpolator 800 to weight the input phases to create an output phase that is a combination of the input phases.

In some examples, the blending weights may be adjusted to move the phase of the blended signal 906 between the phases of the PHO signal 902 and PH90 signal 904. The adjustable weighting enables phase movement at the output without requiring changes to the input clock phases.

The blending operation provides a mechanism for phase adjustment during loopback testing. In some examples, the blender delay may be adjusted in steps that are no greater than a dither range of the CDR loop. This can allow comprehensive testing of phase interpolator codes while maintaining system lock.

The phase relationship between the signals demonstrates how blending can generate intermediate phases between quadrature clock signals. This blending capability enables the system to cover phase ranges spanning multiple unit intervals without requiring additional clock phases from the phase interpolator, thereby reducing the need for additional circuitry or control logic to perform loopback testing.

Figure 10:
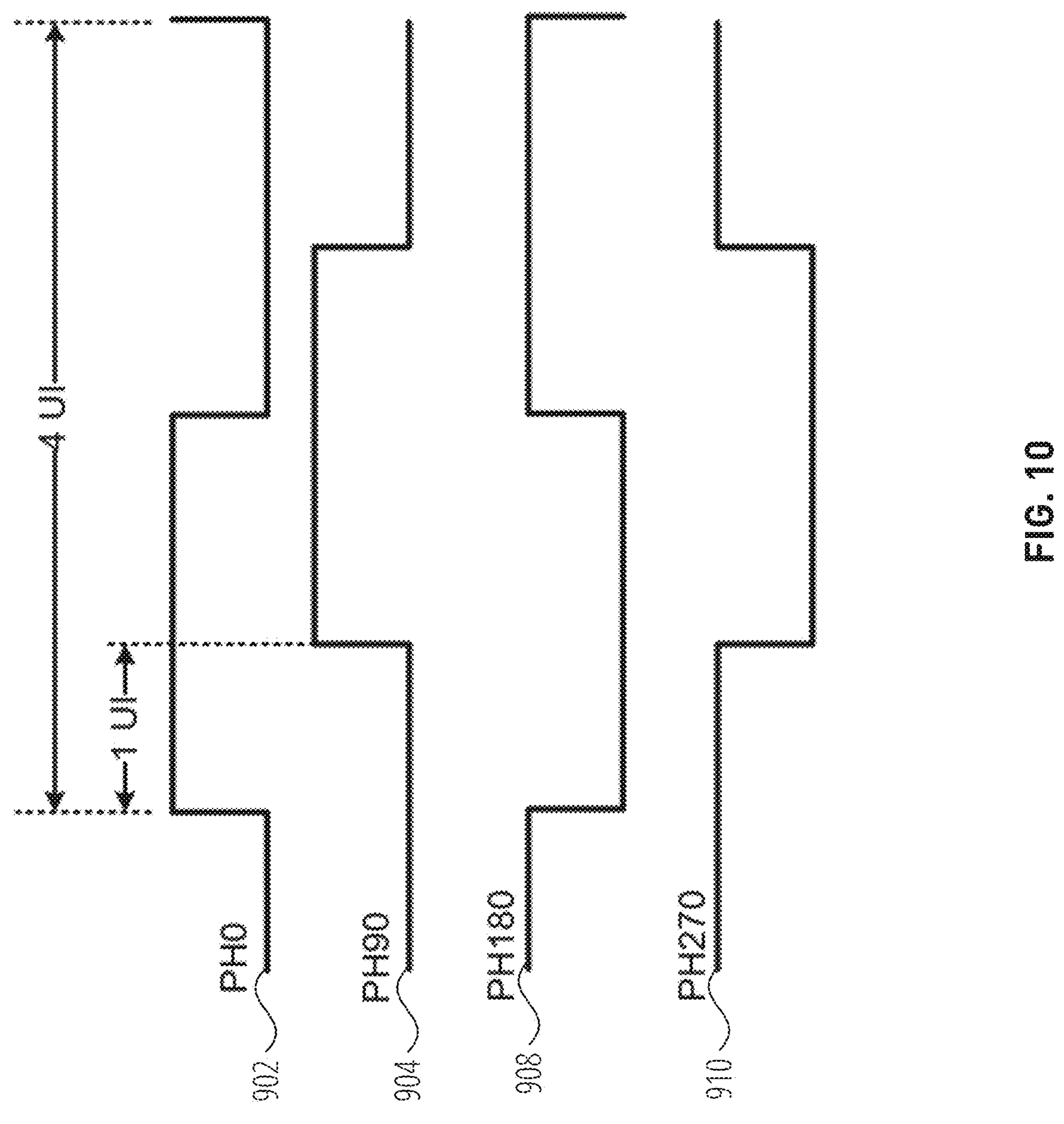
FIG. 10 is a timing diagram illustrating multiple phase-shifted clock signals over four unit intervals, according to some examples.

FIG. 10 is a timing diagram illustrating multiple phase-shifted clock signals over four unit intervals. The timing diagram depicts four clock signals: a PHO signal 902, a PH90 signal 904, a PH180 signal 908, and a PH270 signal 910. These signals represent output phases generated by the phase interpolator stage (e.g., PI 802) of the blending hybrid phase interpolator 800.

The four clock signals are separated by phase shifts of 90 degrees, with each signal operating at a quarter of the input data or loopback data rate. The phase relationships between these signals establish a sequence that spans four unit intervals (UIs) of input data or loopback data. The PHO signal 902 serves as the reference phase, with the PH90 signal 904 delayed by one UI, the PH180 signal 908 delayed by two UIs, and the PH270 signal 910 delayed by three UIs.

In some examples, these clock phases may be generated by an injection-locked ring 208 comprising multiple delay stages. Each delay stage contributes a finite delay, establishing phase-offset versions of the oscillator signal. The delay stages are configured with identical structure and configuration to apply consistent finite delays.

The phase relationships between these signals enable proper sampling of data in the serial link system. The quarter-rate operation allows the system to maintain timing relationships while operating at reduced frequencies compared to the data rate.

The phase spacing between signals may be adjusted through blending operations, which can be performed by a blender 804 as described above. Blending buffers can be used to weight the input phases to create output phases, with adjustable weighting enabling phase movement. The blending operation provides coverage spanning multiple unit intervals without requiring additional clock phases from the phase interpolator.

These clock signals serve as sampling phases for data recovery in loopback testing. The phase relationships enable the system to maintain lock at multiple valid lock points across the four unit intervals, facilitating comprehensive testing of phase interpolator codes.

Figure 11:
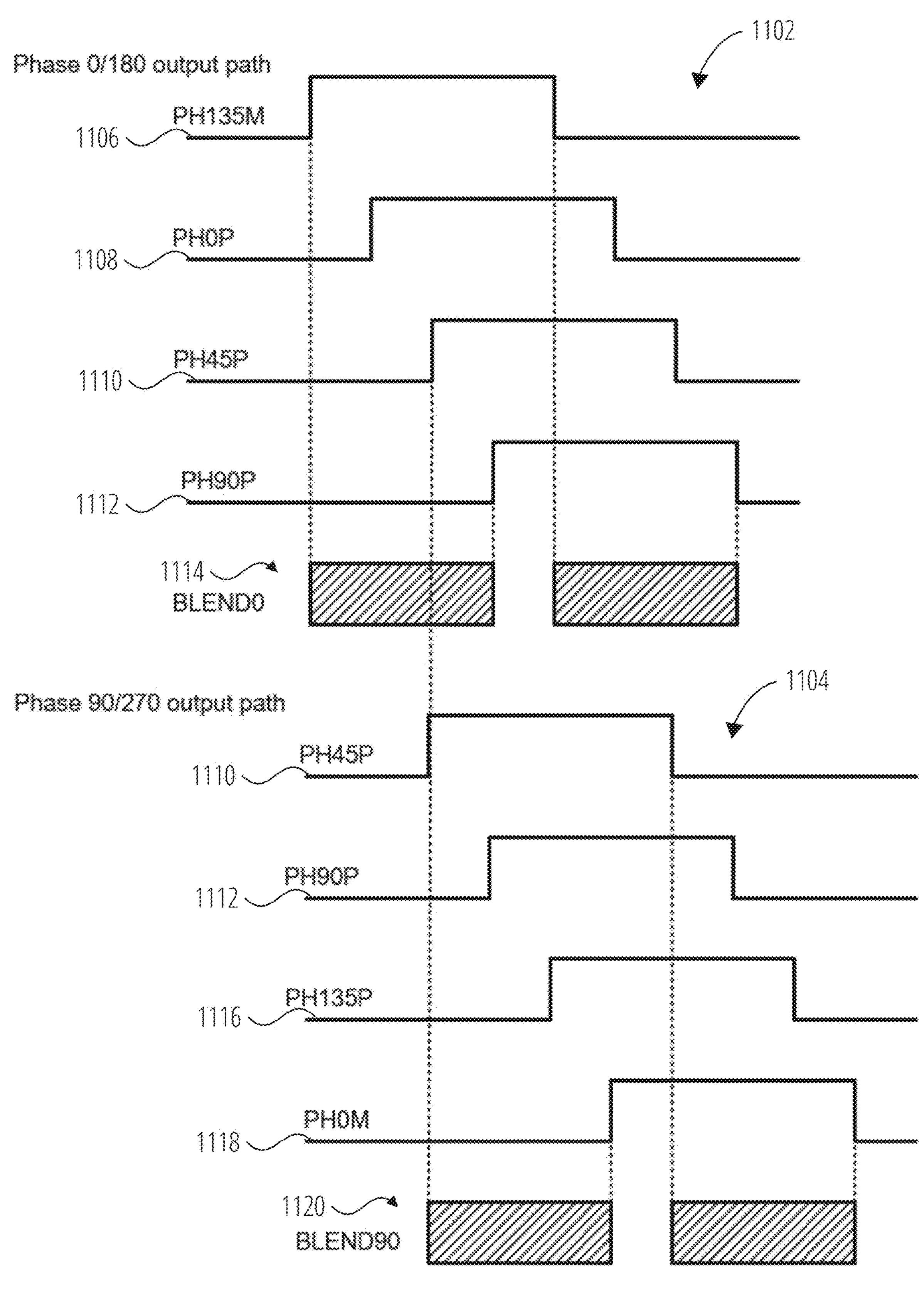
FIG. 11 is a timing diagram illustrating phase blending ranges for output paths, according to some examples.

FIG. 11 is a timing diagram illustrating phase blending ranges for output paths. The timing diagram shows two output paths: a Phase 0/180 output path 1102 and a Phase 90/270 output path 1104. Each output path demonstrates the blending of multiple input phases to generate adjustable output phases.

The Phase 0/180 output path 1102 includes a PH135 minus signal 1106, a PHO plus signal 1108, a PH45 plus signal 1110, and a PH90 plus signal 1112. These signals feed into a blend 0 delay range 1114 (BLEND0) that represents the range of possible phase positions achievable through blending of the input signals.

The Phase 90/270 output path 1104 includes the PH45 plus signal 1110, the PH90 plus signal 1112, a PH135 plus signal 1116, and a PHO minus signal 1118. These signals connect to a blend 90 delay range 1120 (BLEND90) that defines the phase adjustment range for this path.

The blending operation weights the input phases to create output phases that can be positioned between the input phases. In some examples, the blending buffers 806 and 808 provide adjustable weighting that enables phase movement across a range spanning approximately 1.5 unit intervals.

The phase relationships between the input signals establish quadrature spacing, with 90-degree phase shifts between adjacent signals. The blending ranges 1114 and 1120 overlap, enabling continuous phase coverage across multiple unit intervals.

The architecture of the blending hybrid phase interpolator 800 can thereby support testing of phase interpolator codes by allowing adjustment of the blender delay while maintaining clock and data recovery loop lock. In some examples, the blender delay adjustments may be implemented in steps that are no greater than the dither range of the clock and data recovery loop. In some examples, the blending operation may be performed by blending buffers that provide phase averaging to reduce static and rotating skews in the output clock phases. The blending ranges 1114 and 1120 shown in FIG. 11 can enable the system to maintain proper timing relationships while testing different phase interpolator codes.

Figure 12:
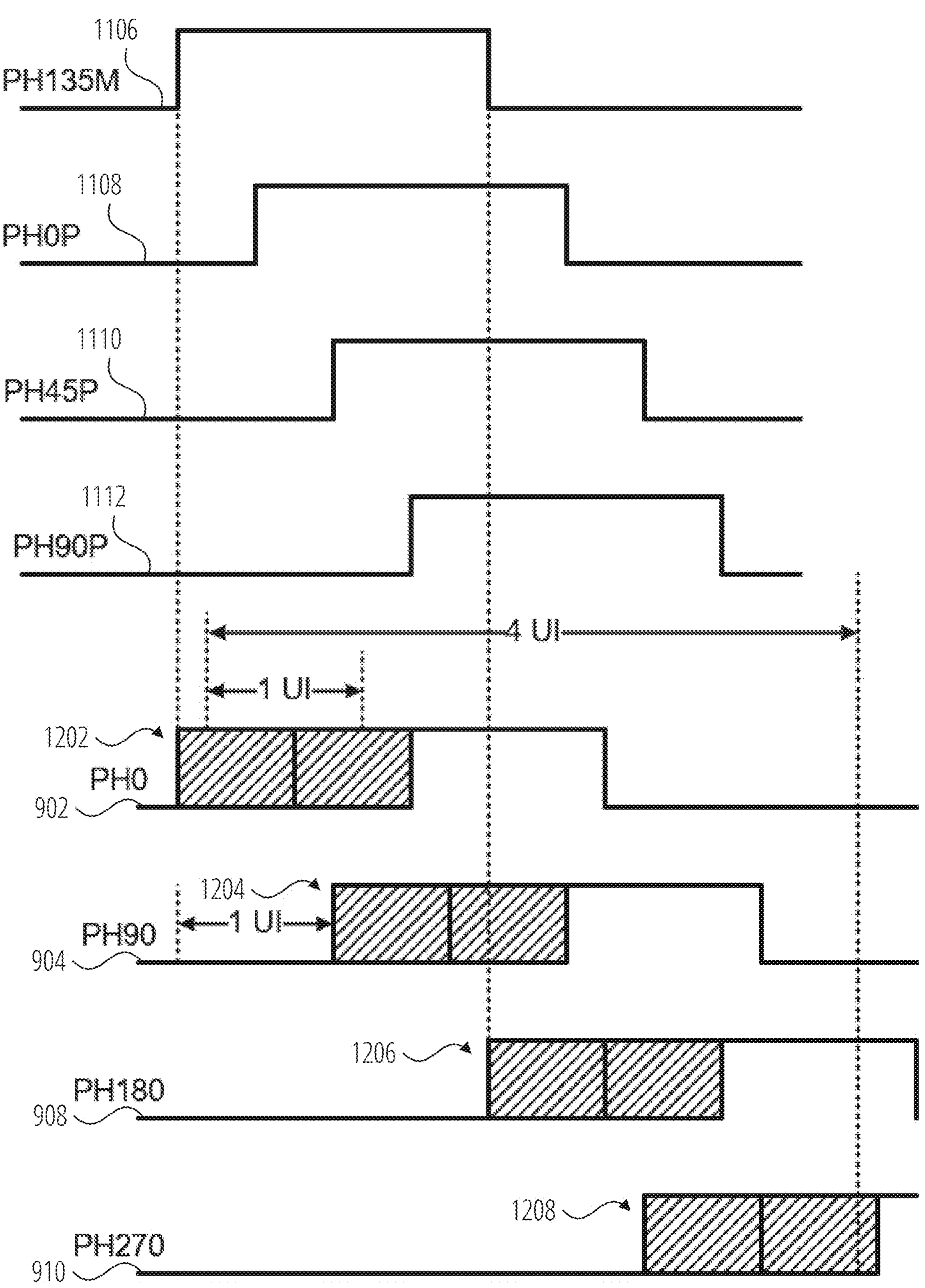
FIG. 12 is a timing diagram illustrating blender delay ranges for multiple clock phases, according to some examples.

FIG. 12 is a timing diagram illustrating blender delay ranges for multiple clock phases. The timing diagram shows input phases including a PH135 minus signal 1106, a PHO plus signal 1108, a PH45 plus signal 1110, and a PH90 plus signal 1112. These signals represent different phase offsets that feed into the blending stage.

The diagram spans four unit intervals (4 UI) and displays four output clock phases: a PHO signal 902, a PH90 signal 904, a PH180 signal 908, and a PH270 signal 910. These output phases are separated by one unit interval (1 UI), operating at quarter rate.

The blender delay ranges are represented by PHO blender delay range 1202, PH90 blender delay range 1204, PH180 blender delay range 1206, and PH270 blender delay range 1208. Each blender delay range indicates the possible phase positions achievable through blending of the input signals. In some examples, the blending buffers provide adjustable weighting that enables phase movement across a range spanning approximately 1.5 unit intervals.

The blender delay ranges overlap, enabling continuous phase coverage across multiple unit intervals, such as 4 UI. The blending operation weights the input phases to create output phases that can be positioned between the input phases. The weighting may be adjusted to move the output phase while maintaining CDR loop lock. In some examples, the blender delay adjustments may be implemented in blender steps that are no greater than the dither range of the CDR loop.

The phase relationships between the signals establish quadrature spacing, with 90-degree phase shifts between adjacent signals. This configuration of the signals can enable testing of phase interpolator codes by allowing adjustment of the blender delay while maintaining proper timing relationships.

Figure 13:
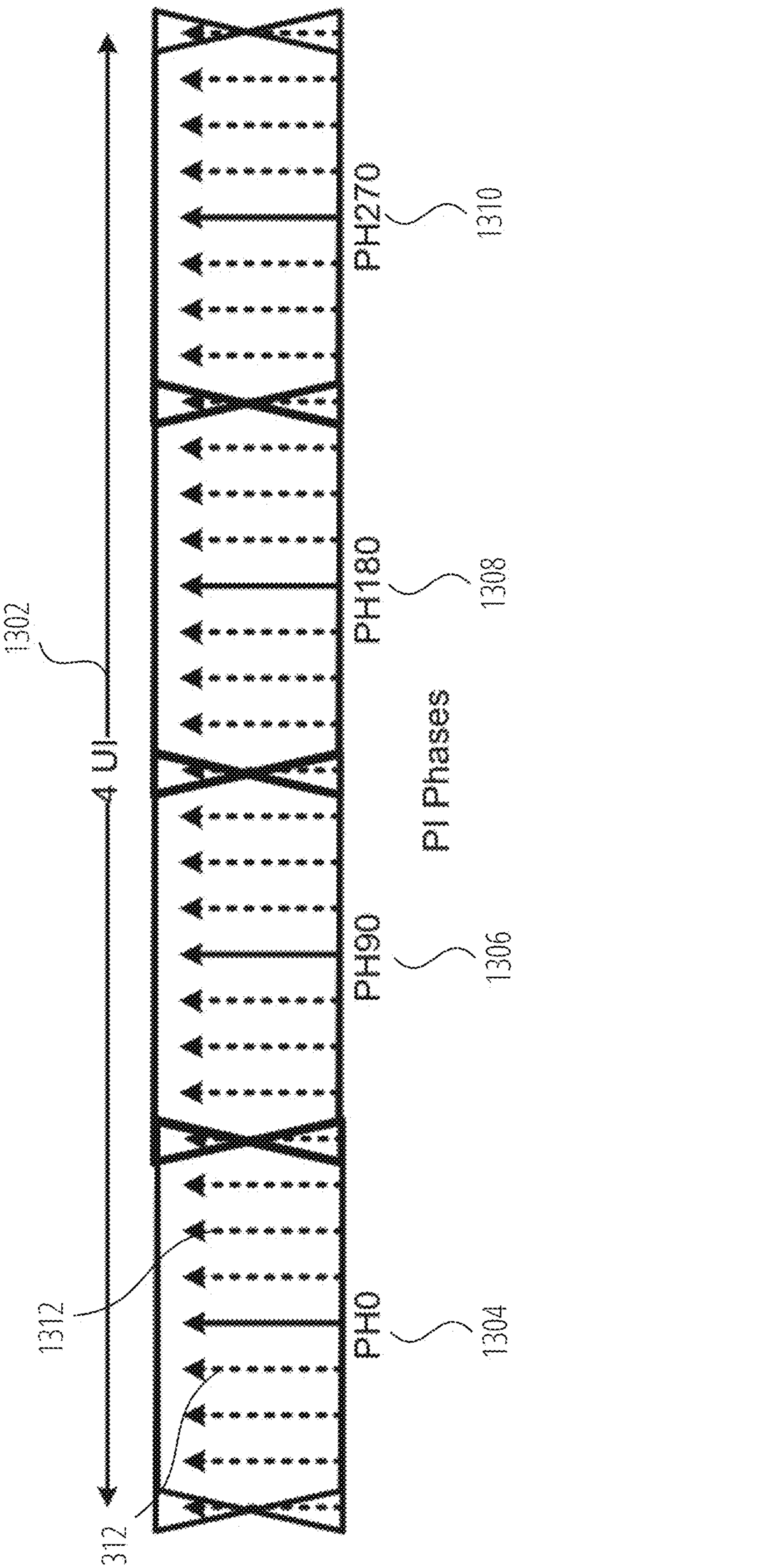
FIG. 13 is a timing diagram illustrating phase interpolator output phases spread over four unit intervals, according to some examples.

FIG. 13 is a timing diagram illustrating phase interpolator output phases spread over four unit intervals. The timing diagram shows a four unit intervals 1302 range that defines the total phase coverage range of the phase interpolator outputs. Within this range, four phase-shifted clock signals are displayed: a PHO phase 1304, a PH90 phase 1306, a PH180 phase 1308, and a PH270 phase 1310.

The PI phases 1312 distributed across the four unit intervals 1302 range represent the possible phase positions that can be generated by the phase interpolator, such as blending hybrid phase interpolator 800.

In some examples, the PHO phase 1304 serves as the reference phase, with the PH90 phase 1306 delayed by one UI, the PH180 phase 1308 delayed by two UIs, and the PH270 phase 1310 delayed by three UIs. In some examples, the phase relationships are established through an injection-locked ring comprising multiple delay stages. Each delay stage contributes a finite delay, with the number of delay stages determining the amount of phase shift per stage. For a four-stage configuration, each delay stage contributes a 45-degree phase shift.

The phase coverage spanning four unit intervals 1302 enables the system to accommodate frequency offsets between transmitter and receiver clocks in actual system operation. This extended range ensures proper operation when the phase interpolator must rotate through its complete phase range rather than settling at a single phase position.

Figure 14:
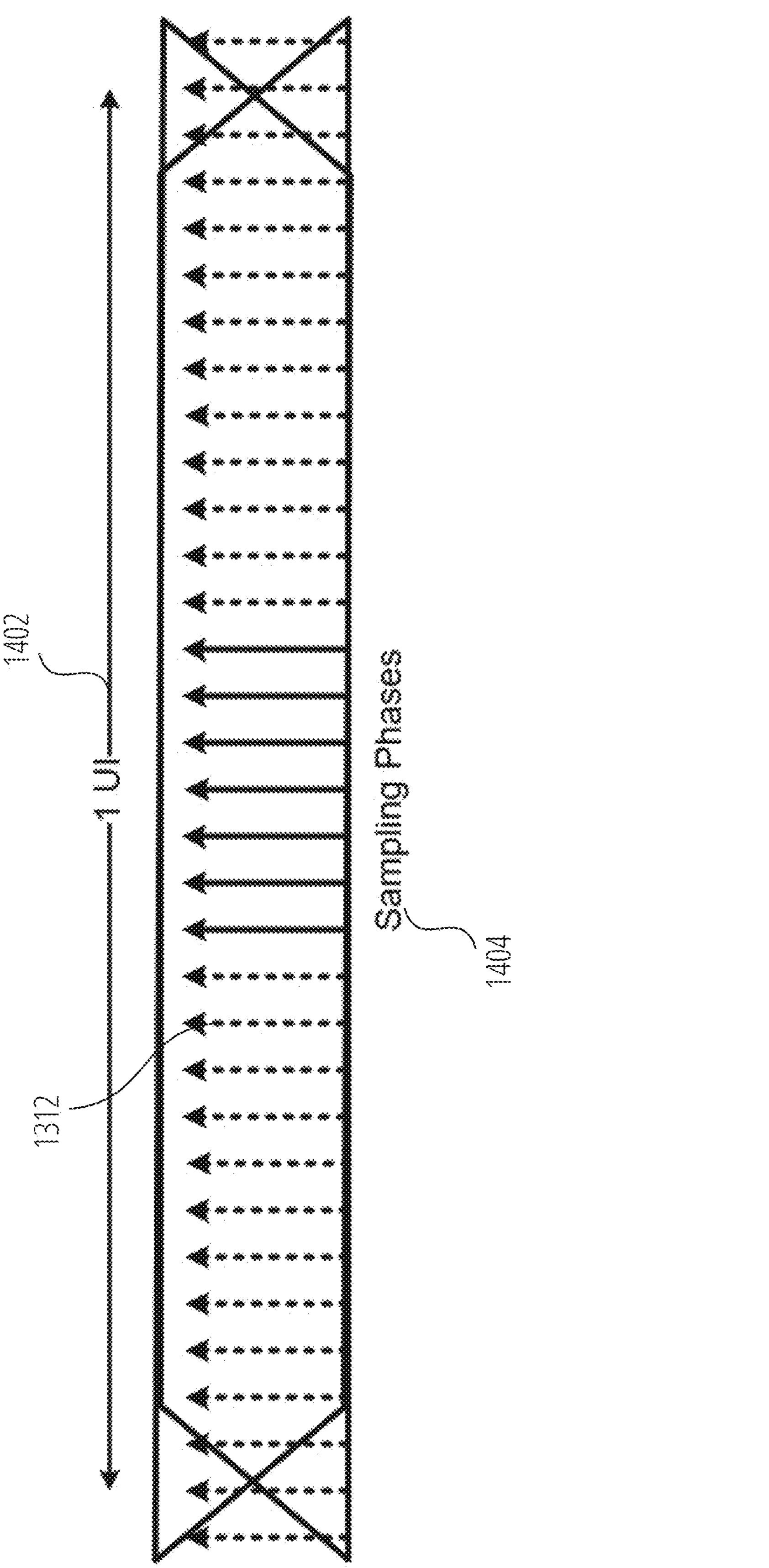
FIG. 14 is a timing diagram illustrating sampling phases within a unit interval, according to some examples.

FIG. 14 is a timing diagram illustrating sampling phases within a unit interval. The timing diagram shows a PI phase 1312 and a one unit interval 1402 range containing sampling phases 1404. The sampling phases 1404 represent the clock phases used to sample the received data in the serial link system.

When operating in loopback mode, the CDR loop may causes the phase steps to dither by a small number of phase codes, such as 4-5 codes, around the lock point. This dither represents normal behavior in loopback mode when the feedback loop controls the sampling phase.

In some examples, the dither range may be adjusted by modifying the CDR loop bandwidth. In some examples, increasing the bandwidth results in more dither as the loop adjusts to jitter quickly and tends to overshoot. Conversely, decreasing the bandwidth reduces the dither range.

The sampling phases 1404 can be generated by a hybrid phase interpolator such as blending hybrid phase interpolator 800. The phase interpolator mixers generate injection signals with inverse step size profiles, while the injection-locked ring averages these profiles to produce output clock phases with constant step sizes.

The phase relationship between the sampling phases 1404 and the data enables proper data recovery. In loopback mode, the CDR maintains this relationship by adjusting the phase interpolator codes to keep the sampling phases centered in the data eye. The dither range of the sampling phases 1404 establishes requirements for blender delay step sizes during testing. In some examples, the blender delay adjustments may be implemented in blender steps that are no greater than the dither range to ensure comprehensive coverage of phase interpolator codes while maintaining system lock.

Figure 15:
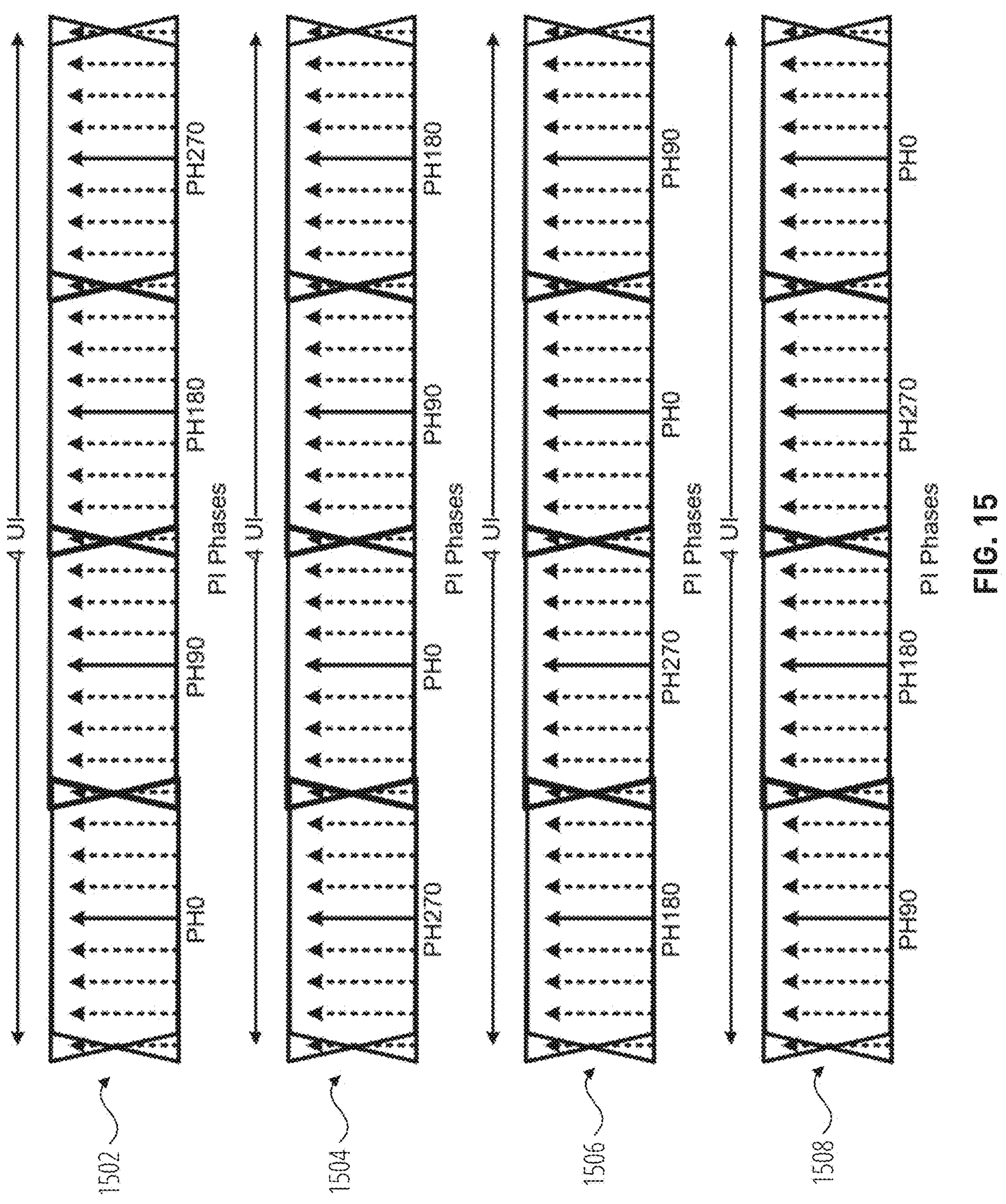
FIG. 15 is a timing diagram illustrating valid lock points for phase interpolator output phases, according to some examples.

FIG. 15 is a timing diagram illustrating valid lock points for phase interpolator output phases. The timing diagram shows four valid lock points: a first valid lock point 1502, a second valid lock point 1504, a third valid lock point 1506, and a fourth valid lock point 1508. Each lock point represents a stable operating condition where the CDR loop maintains phase alignment between the sampling clock and data.

The phase interpolator output phases span four unit intervals (4 UI), with each valid lock point separated by one unit interval. At each lock point, the phase relationships between the PHO, PH90, PH180, and PH270 signals are maintained with 90-degree phase shifts between adjacent phases. The multiple valid lock points arise from the quarter-rate architecture of the system.

In some examples, when operating in loopback mode, the CDR loop may lock to any of these four lock points since they all provide proper phase alignment for data sampling. The system may transition between these lock points by adjusting the phase interpolator code by one unit interval.

At each valid lock point, the CDR loop may cause the phase steps to dither by 4-5 codes, as described above.

The testing techniques described herein may utilize these multiple lock points to achieve comprehensive coverage of phase interpolator codes. Example techniques may involve sweeping the blender delay at each lock point, then adjusting the phase interpolator code to target the next valid lock point. This sequence repeats until all phase interpolator codes have been tested.

Figure 16:
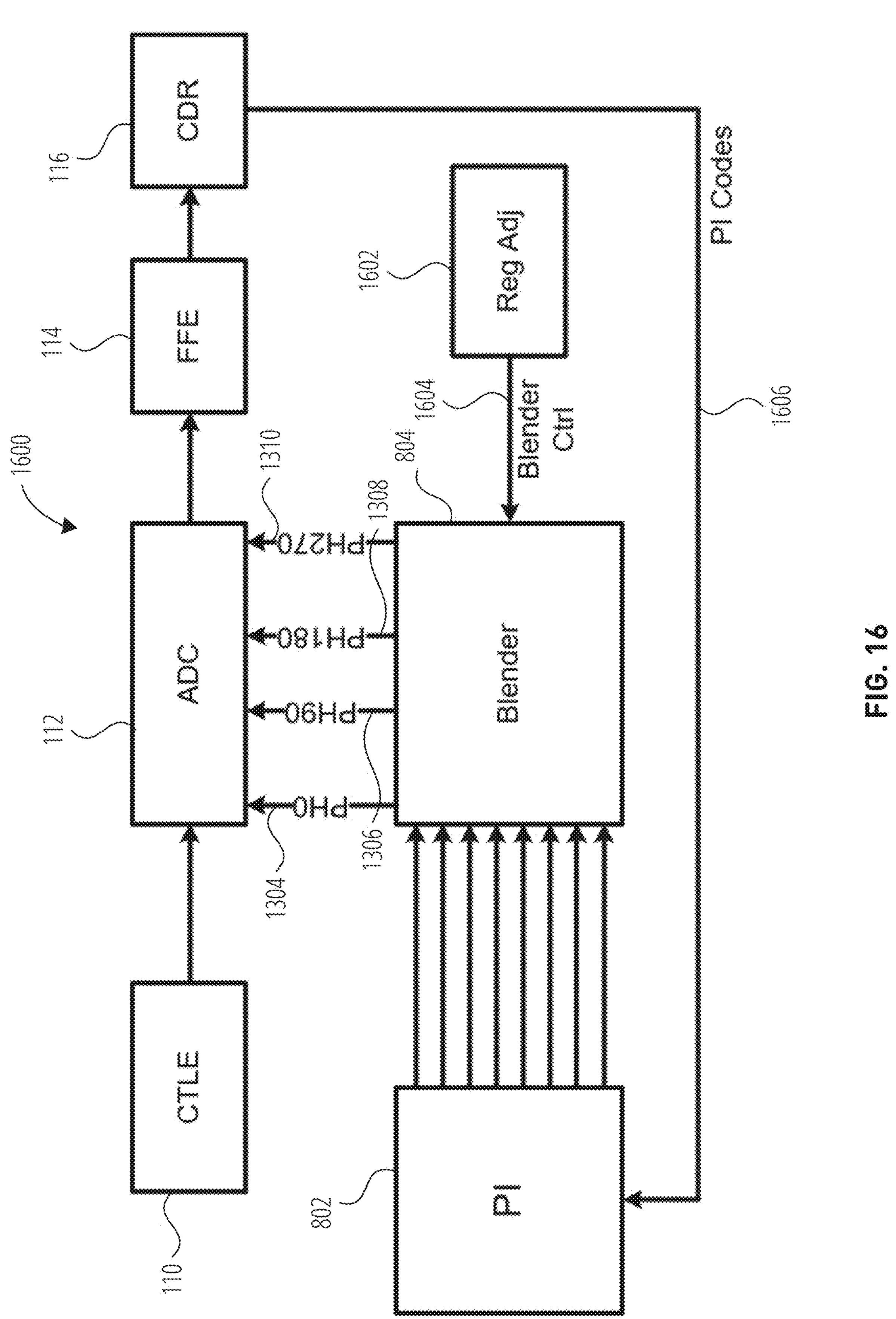
FIG. 16 is a block diagram illustrating a clock and data recovery system with phase interpolator and blender control, according to some examples.

FIG. 16 is a block diagram illustrating a receiver path 1600 with phase interpolator and blender control, as used in loopback testing with a blending hybrid phase interpolator 800. It will be appreciated that the receiver path 1600 can replace the corresponding portions of the loopback test configuration 100 of FIG. 1 to perform example methods described herein.

As in the conventional loopback test configuration 100 of FIG. 1, the receiver path 1600 includes a CTLE 110, an ADC 112, and an FFE 114 that process the received signal. A CDR block 116 receives the processed data and generates control signals for phase adjustment.

The CDR block 116 interfaces with both a PI 802 block and a blender 804 block of the blending hybrid phase interpolator 800 of FIG. 8 to maintain proper timing relationships. The PI phase code 1606 from the CDR block 116 determines the phase interpolator settings, as described above with reference to FIG. 8.

The blender 804 generates four phase-shifted clock signals, corresponding to the four CMOS clock phases shown as the output in FIG. 8: a PHO phase 1304, a PH90 phase 1306, a PH180 phase 1308, and a PH270 phase 1310. These phases operate at quarter rate with 90-degree spacing between adjacent phases. A blender control block or blender control circuit, shown as register adjustment block 1602, provides a blender control signal 1604 to the blender 804 to adjust the blender weights and thereby the blender delay.

In some examples, loopback self-testing methods described herein may be implemented by logic of the CDR block 116 to vary the PI phase code 1606 and logic of the register adjustment block 1602 to adjust the blender weights. Collectively, the portions of the CDR block 116 and/or register adjustment block 1602 used to control these operations may be referred to herein as control logic of the system.

Figure 17:
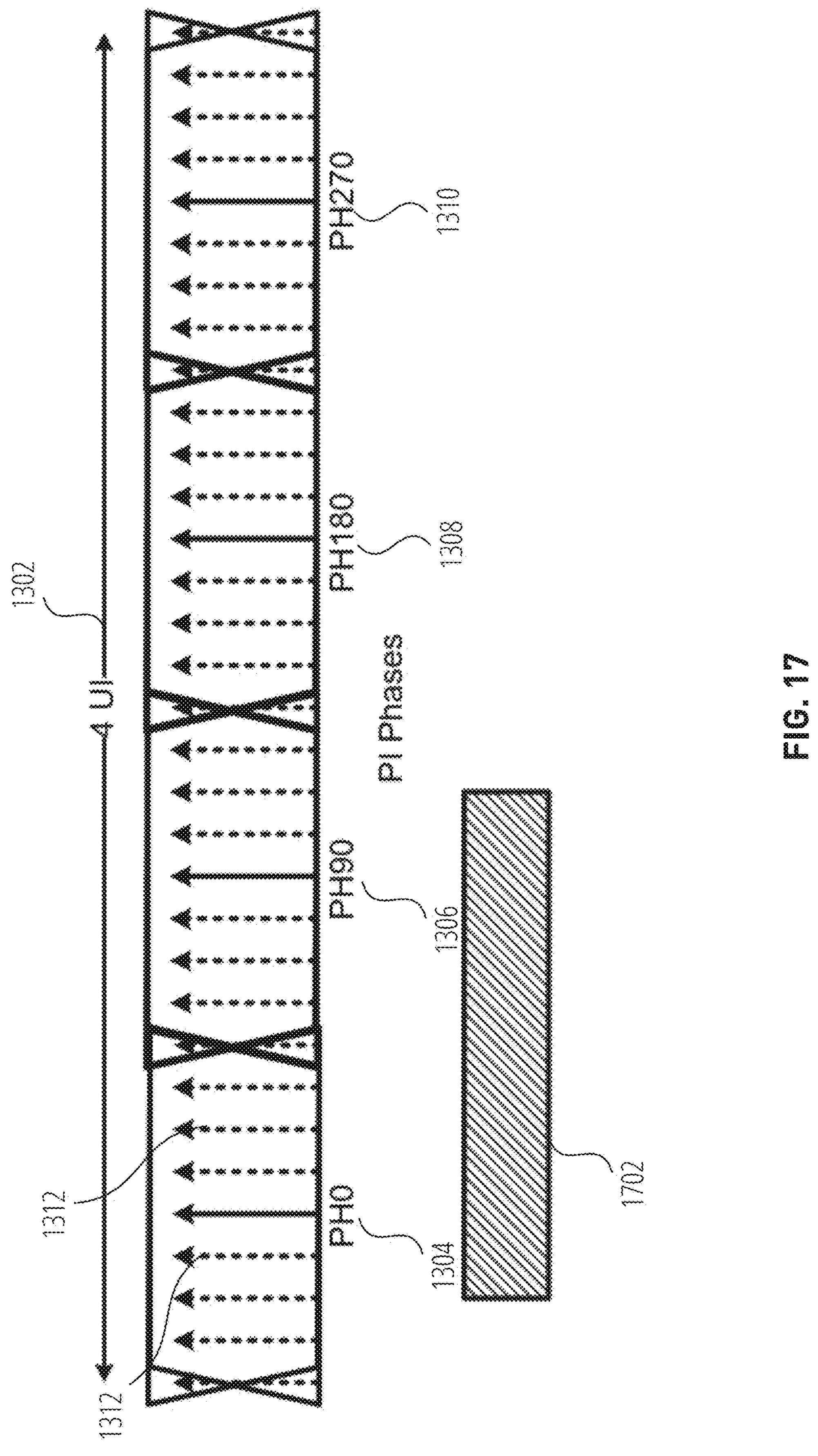
FIG. 17 is a timing diagram illustrating phase interpolator output phases with blender delay range, according to some examples.

FIG. 17 is a timing diagram illustrating phase interpolator output phases with a blender delay range 1702. The timing diagram shows the same four unit intervals 1302 range as FIG. 13, containing the same phase-shifted clock signals: PHO phase 1304, PH90 phase 1306, PH180 phase 1308, and PH270 phase 1310. The PI phases 1312 represent the possible phase positions that can be generated by the phase interpolator.

A blender delay range 1702 indicates the phase adjustment range achievable through the blending operation. The blender delay range 1702 represents the region where the clock and data recovery (CDR) loop maintains lock while testing different phase interpolator codes. In some examples, the blending buffers 806 and 808 provide adjustable weighting that enables phase movement across a range spanning approximately 1.5 unit intervals.

Figure 18:
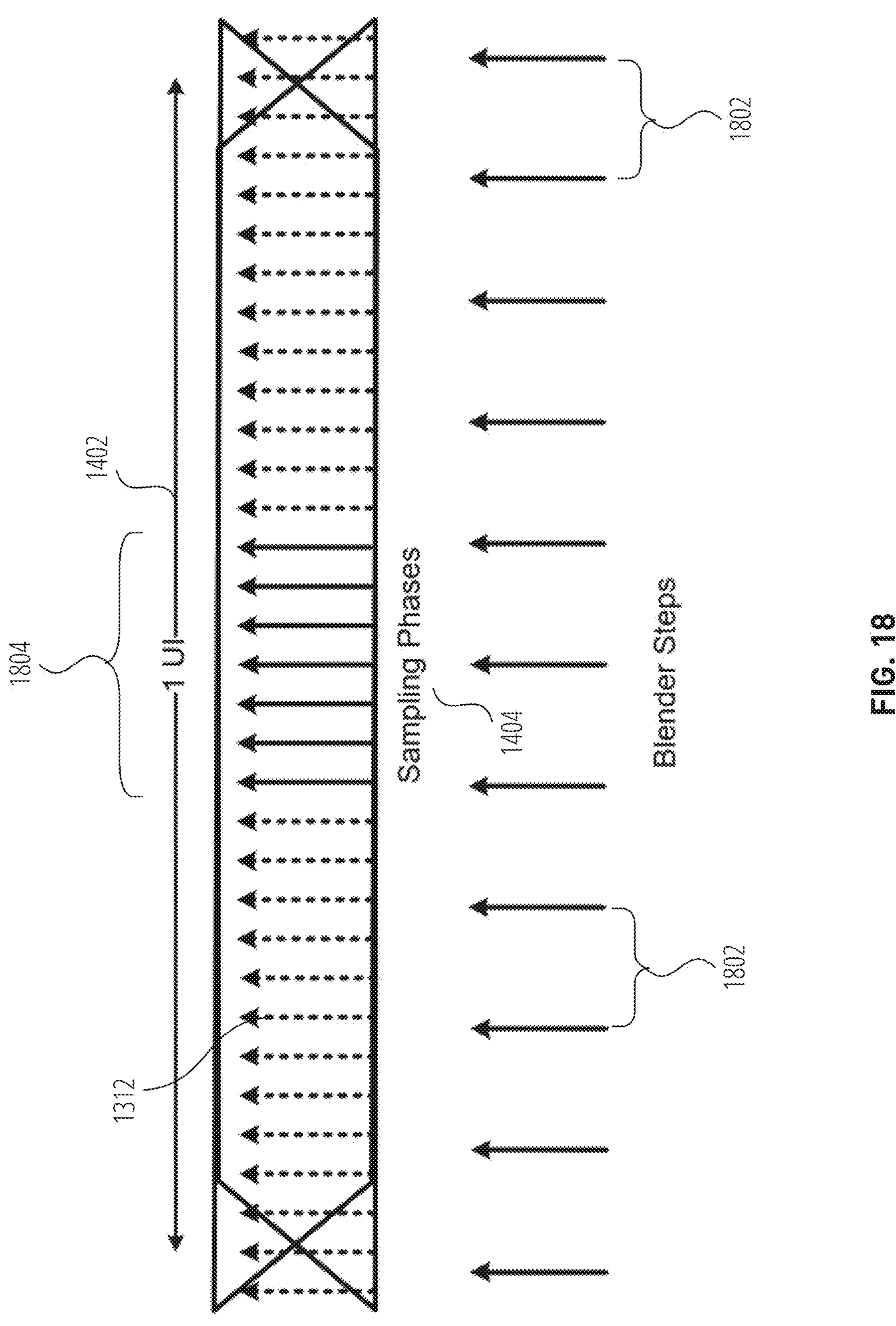
FIG. 18 is a timing diagram illustrating sampling phases and blender steps within a unit interval, according to some examples.

FIG. 18 is a timing diagram illustrating sampling phases sampling phase 1404 and blender steps 1802 over a one unit interval 1402 range. The sampling phases 1404 represent the clock phases used by the CDR loop to sample the received data. The blender steps 1802 indicate the phase adjustment increments implemented by the blender block.

In some examples, the blender steps 1802 are sized to be no greater than the dither range 1804 of the CDR loop. The dither range 1804 represents the natural variation in phase steps when the CDR loop maintains lock, typically spanning a small number of PI codes (such as 4-5 codes, or 7 codes as shown in the illustrated example). The relationship between the blender steps 1802 and sampling phases 1404 enables comprehensive testing of phase interpolator codes. In some examples, the blender step 1802 size is selected to ensure that the CDR loop's natural dither behavior covers all intermediate phase positions between blender steps 1802.

In some examples, the sampling phases 1404 are generated through a hybrid phase interpolator (such as blending hybrid phase interpolator 800) with an architecture that includes phase interpolator mixers and an injection-locked ring stage.

The dither range 1804 of the sampling phases 1404 may be adjusted by modifying the CDR loop bandwidth. In some examples, increasing the CDR loop bandwidth results in more dither as the loop adjusts to jitter quickly and tends to overshoot. This adjustability enables optimization of the relationship between blender steps 1802 and the dither range 1804.

Figure 19:
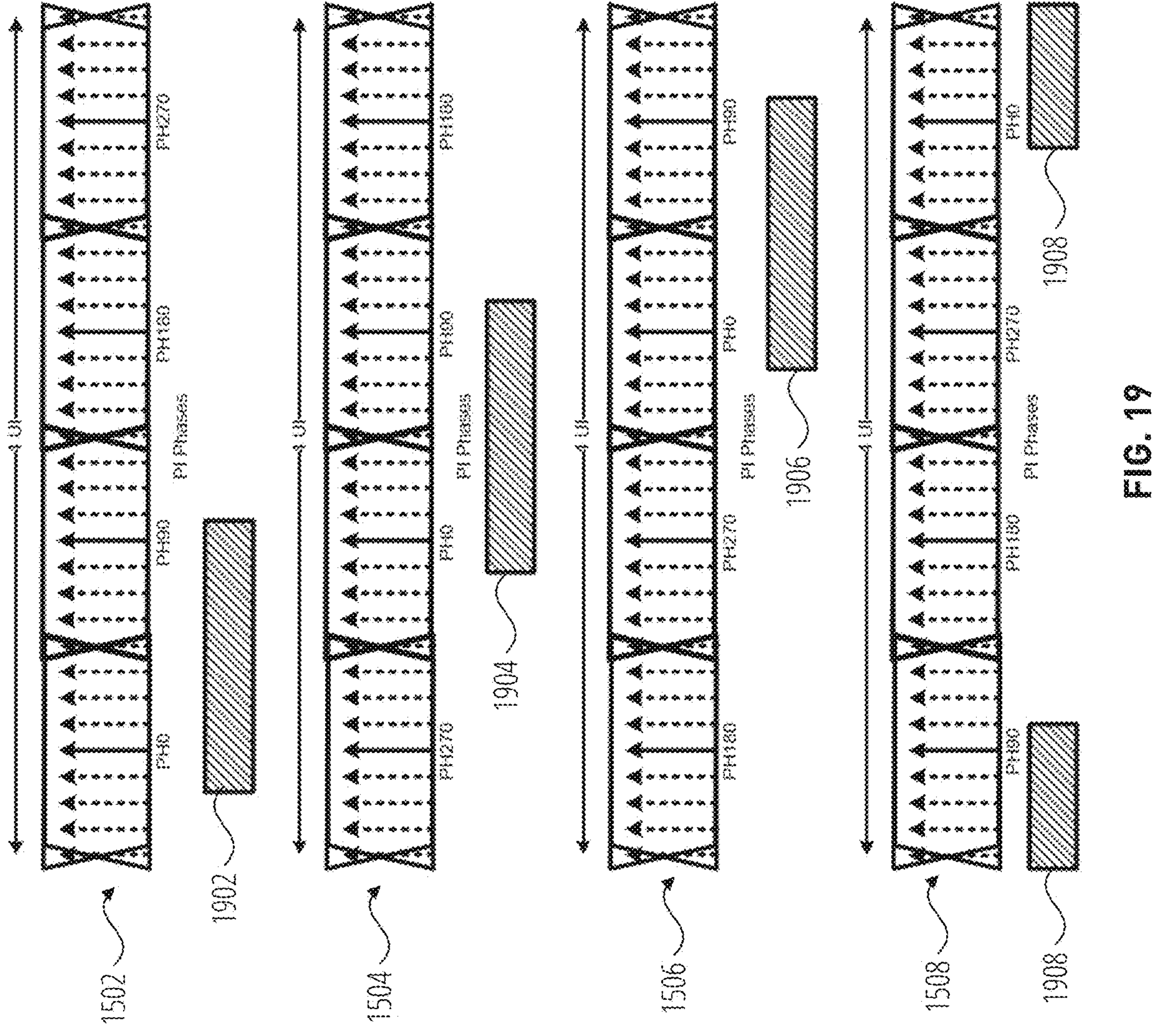
FIG. 19 is a timing diagram illustrating blender delay ranges across multiple valid lock points, according to some examples.

FIG. 19 is a timing diagram illustrating blender delay ranges at multiple valid lock points. The timing diagram shows four valid lock points: a first valid lock point 1502, a second valid lock point 1504, a third valid lock point 1506, and a fourth valid lock point 1508. Each lock point represents a stable operating condition where the CDR loop maintains phase alignment between the sampling clock and the data (e.g., the loopback signal).

At each valid lock point, the phase relationships between PHO, PH90, PH180, and PH270 signals are maintained with 90-degree phase shifts between adjacent phases.

The blender delay ranges for each lock point are represented by a first blender delay range 1902, a second blender delay range 1904, a third blender delay range 1906, and a fourth blender delay range 1908. Each blender delay range spans approximately 1.5 unit intervals, enabling phase adjustment while maintaining CDR lock.

In some examples, the testing sequence progresses through the valid lock points by adjusting the phase interpolator code by one unit interval to transition between lock points. At each lock point, the blender delay is swept across its range while checking for bit errors. This process repeats until all phase interpolator codes have been tested.

The phase relationships at each lock point can be maintained through an injection-locked ring 208 having multiple delay stages. The injection-locked ring averages the step size profiles of injection signals from phase interpolator mixers to produce output clock phases with constant step sizes. This architecture enables stable operation while testing different phase interpolator codes through combinations of coarse phase interpolator adjustments and finer blender delay modifications.

Figure 20:
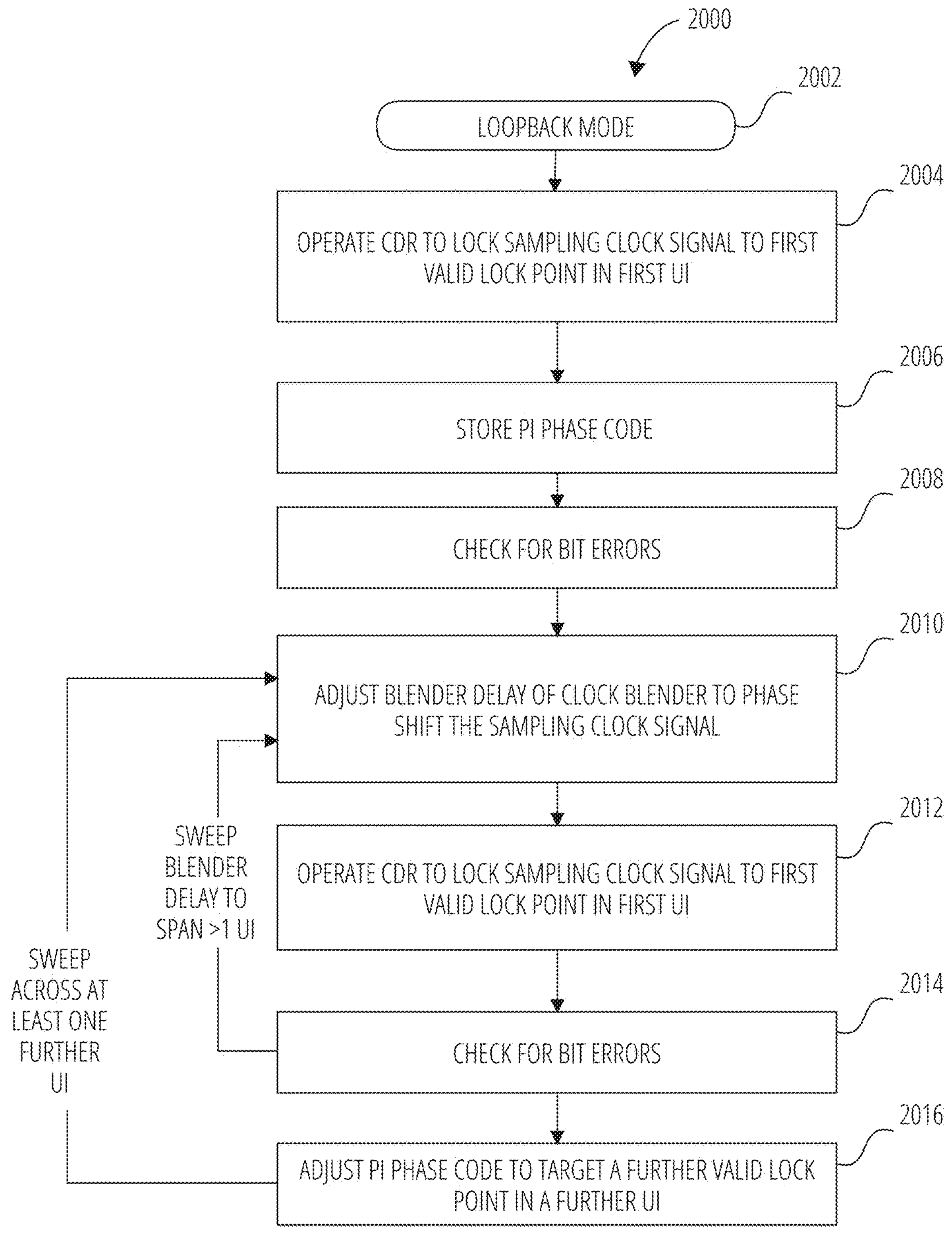
FIG. 20 is a flowchart illustrating a method for loopback self-testing of a phase interpolator in a serial link system, according to some examples.

FIG. 20 illustrates an example method 2000 for internal loopback testing of a phase interpolator. In some examples, the method 2000 enables comprehensive verification of phase interpolator functionality while maintaining proper timing relationships. Whereas the method 2000 is described with reference to the various circuits described herein, it will be appreciated that some examples may implement method 2000 using different configurations of circuits and subcircuits.

Although the example method 2000 depicts a particular sequence of operations, the sequence may be altered without departing from the scope of the present disclosure. For example, some of the operations depicted may be performed in parallel or in a different sequence that does not materially affect the function of the method 2000. In other examples, different components of an example device or system that implements the method 2000 may perform functions at substantially the same time or in a specific sequence.

The method 2000 begins with operation 2002, which establishes a loopback mode. In some examples, establishing the loopback mode involves routing a transmitter built-in self-test data signal (e.g., transmitter BIST data 130) through a transmitter serializer 106 and transmitter driver 108 to generate the loopback signal (e.g., loopback data 124).

At operation 2004, the CDR loop operates to lock the sampling clock signal to a first valid lock point (e.g., first valid lock point 1502) in a first unit interval (UI) of the loopback signal. The CDR loop includes a phase interpolator (e.g., PI 802) and phase blender (e.g., blender 804) for adjusting the phase of sampling clocks.

Operation 2006 stores the phase interpolator phase code (e.g., PI phase code 1606) corresponding to the locked condition. This code represents the phase adjustment applied by the PI 802 to maintain proper timing alignment between the sampling clock signal and the data signal. In some examples, the PI phase code 1606 can be stored in a register or other memory of the CDR block 116 or another component of the receiver path 1600 or of the system as a whole.

Operation 2008 performs bit error checking on the loopback signal as sampled by the locked sampling clock signal. This verifies proper data recovery at the current phase interpolator settings.

At operation 2010, the register adjustment block 1602 adjusts the blender delay of the blender 804 to phase shift the sampling clock signal. In some examples, the blender delay adjustments are implemented in steps no greater than the dither range of the CDR loop, as described above.

Operation 2012 operates the CDR loop to lock the sampling clock signal to the first valid lock point in the first UI of the loopback signal following the blender delay adjustment. This maintains proper timing relationships as the phase is adjusted.

Operation 2014 performs another bit error check to verify proper operation at the new phase position.

The method 2000 then returns to operation 2010 to repeat operation 2010 through operation 2014 one or more times. These operations repeat for multiple blender delay values such that the values of the blender delay span at least one UI (e.g., approximately 1.5 UI or slightly less, but at least 1 UI).

After the entire first UI has been swept by the blender delay, the method 2000 proceeds to operation 2016. The PI phase code 1606 is adjusted to target a further valid lock point (e.g., second valid lock point 1504) in a further UI. The method 2000 then returns again to operation 2010 to begin another sweep loop of operations 2010 through 2014 within the further UI. Operation 2016 may be repeated one or more times for one or more further valid lock points, such as second valid lock point 1504, third valid lock point 1506, and fourth valid lock point 1508 (thereby sweeping across a span of four UIs). This can enable testing of phase interpolator codes across multiple unit intervals by combining coarse phase interpolator adjustments with finer blender delay modifications.

An example machine architecture will now be described, providing examples suitable for implementing control logic for performing one or more of the operations of the method

2000 described above as instructions executed by one or more processors of a system, such as the machine described with reference to FIG. 21. In some examples, one or more of the signals described above can be generated by firmware or other software instructions executed by a machine, as described below.

Figure 21:
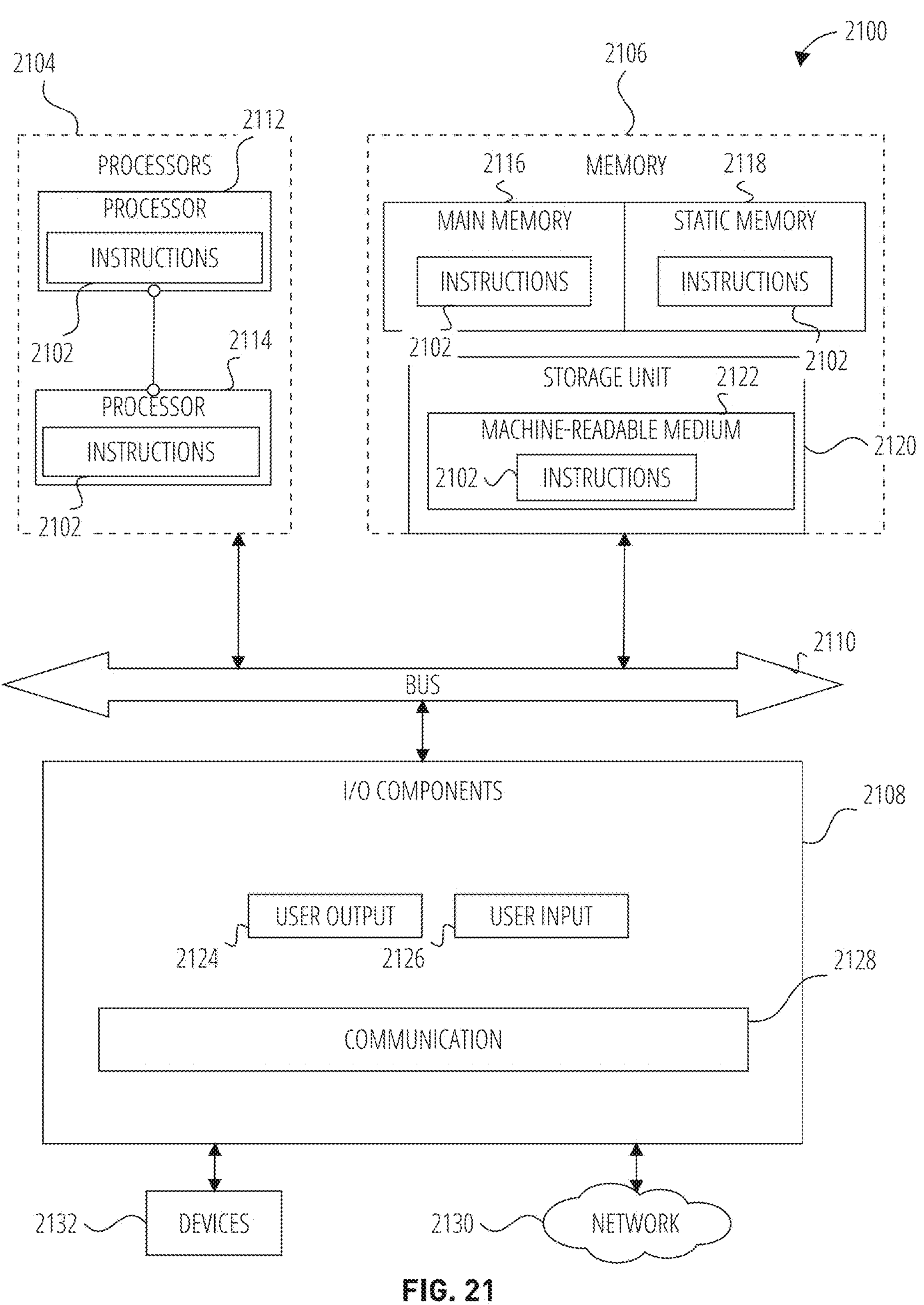
FIG. 21 is a diagrammatic representation of a machine in the form of a computer system within which a set of instructions may be executed to cause the machine to perform any one or more of the methodologies discussed herein, according to some examples.

FIG. 21 is a diagrammatic representation of the machine 2100 within which instructions 2102 (e.g., software, a program, an application, an applet, an app, or other executable code) for causing the machine 2100 to perform any one or more of the methodologies discussed herein may be executed. For example, the instructions 2102 may cause the machine 2100 to execute any one or more operations of the methods described herein, and/or to implement one or more components or functions of the systems described herein. The instructions 2102 transform the general, non-programmed machine 2100 into a particular machine 2100 programmed to carry out the described and illustrated functions in the manner described. The machine 2100 may operate as a standalone device or may be coupled (e.g., networked) to other machines. In a networked deployment, the machine 2100 may operate in the capacity of a server machine or a client machine in a server-client network environment, or as a peer machine in a peer-to-peer (or distributed) network environment. The machine 2100 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 2102, sequentially or otherwise, that specify actions to be taken by the machine 2100. Further, while a single machine 2100 is illustrated, the term "machine" shall also be taken to include a collection of machines that individually or jointly execute the instructions 2102 to perform any one or more of the methodologies discussed herein. In some examples, the machine 2100 may comprise both client and server systems, with certain operations of a particular method or algorithm being performed on the server-side and with certain operations of the particular method or algorithm being performed on the client-side.

The machine 2100 may include processors 2104, memory 2106, and input/output I/O components 2108, which may be configured to communicate with each other via a bus 2110. In an example, the processors 2104 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 2112 and a processor 2114 that execute the instructions 2102. The term "processor" is intended to include multi-core processors that may comprise two or more independent processors (sometimes referred to as "cores") that may execute instructions contemporaneously. Although FIG. 21 shows multiple processors 2104, the machine 2100 may include a single processor with a single-core, a single processor with multiple cores (e.g., a multi-core processor), multiple processors with a single core, multiple processors with multiples cores, or any combination thereof.

The memory 2106 includes a main memory 2116, a static memory 2118, and a storage unit 2120, both accessible to the processors 2104 via the bus 2110. The main memory 2106, the static memory 2118, and storage unit 2120 store the instructions 2102 embodying any one or more of the methodologies or functions described herein. The instructions 2102 may also reside, completely or partially, within the main memory 2116, within the static memory 2118, within machine-readable medium 2122 within the storage unit 2120, within at least one of the processors 2104 (e.g., within the processor's cache memory), or any suitable combination thereof, during execution thereof by the machine 2100.

The I/O components 2108 may include a wide variety of components to receive input, provide output, produce output, transmit information, exchange information, capture measurements, and so on. The specific I/O components 2108 that are included in a particular machine will depend on the type of machine. For example, portable machines such as mobile phones may include a touch input device or other such input mechanisms, while a headless server machine will likely not include such a touch input device. It will be appreciated that the I/O components 2108 may include many other components that are not shown in FIG. 21. In various examples, the I/O components 2108 may include user output components 2124 and user input components 2126. The user output components 2124 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 2126 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

Communication may be implemented using a wide variety of technologies. The I/O components 2108 further include communication components 2128 operable to couple the machine 2100 to a network 2130 or devices 2132 via respective coupling or connections. For example, the communication components 2128 may include a network interface component or another suitable device to interface with the network 2130. In further examples, the communication components 2128 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 2132 may be another machine or any of a wide variety of peripheral devices (e.g., a peripheral device coupled via a USB).

Moreover, the communication components 2128 may detect identifiers or include components operable to detect identifiers. For example, the communication components 2128 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph™, MaxiCode, PDF417, Ultra Code, UCC RSS-2D bar code, and other optical codes), or acoustic detection components (e.g., microphones to identify tagged audio signals). In addition, a variety of information may be derived via the communication components 2128, such as location via Internet Protocol (IP) geolocation, location via Wi-Fi® signal triangulation, location via detecting an NFC beacon signal that may indicate a particular location, and so forth.

The various memories (e.g., main memory 2116, static memory 2118, and memory of the processors 2104) and storage unit 2120 may store one or more sets of instructions and data structures (e.g., software) embodying or used by any one or more of the methodologies or functions described herein. These instructions (e.g., the instructions 2102), when executed by processors 2104, cause various operations to implement the disclosed examples.

The instructions 2102 may be transmitted or received over the network 2130, using a transmission medium, via a network interface device (e.g., a network interface component included in the communication components 2128) and using any one of several well-known transfer protocols (e.g., hypertext transfer protocol (HTTP)). Similarly, the instructions 2102 may be transmitted or received using a transmission medium via a coupling (e.g., a peer-to-peer coupling) to the devices 2132.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

Specific examples are now described.

Example 1 is a method for loopback self-testing of a phase interpolator (PI) in a serial link system, the method comprising: operating a clock and data recovery (CDR) loop in a loopback mode until a sampling clock signal locks to a first valid lock point in a first unit interval (UI) of a loopback signal, the CDR loop comprising: the PI; and a phase blender for blending weights of multiple clock signals phase offset from each other to apply a blender delay to the sampling clock signal; storing a PI phase code corresponding to a phase adjustment of the locked sampling clock signal; checking for bit errors of the loopback signal as sampled by the locked sampling clock signal; sweeping the blender delay by repeating one or more times: adjusting the blender delay of the phase blender to phase shift the sampling clock signal; operating the CDR loop to lock the sampling clock signal; and checking for bit errors, such that values of the blender delay span at least one UI of phase; and sweeping across one or more further UIs by repeating, for each further UI: adjusting the PI phase code to target a further valid lock point in the further UI; and sweeping the blender delay.

In Example 2, the subject matter of Example 1 includes, wherein: the adjusting of the blender delay comprises adjusting the blender delay by a blender step spanning a phase that is no greater than a dither range of the CDR loop.

In Example 3, the subject matter of Example 2 includes, prior to operating the CDR loop in the loopback mode, adjusting a bandwidth of the CDR loop to adjust the dither range.

In Example 4, the subject matter of Examples 2-3 includes, wherein: the one or more further UIs consists of three further UIs, such that the method checks for bit errors when locked to four valid lock points over four UIs.

In Example 5, the subject matter of Examples 1-4 includes, wherein: the blending of the weights of the multiple clock signals comprises: blending outputs of two or more blending buffers to weight multiple input phases to create an output phase that is a combination of the input phases, the blender delay being based on the output phase.

In Example 6, the subject matter of Examples 1-5 includes, wherein: the PI comprises an injection-locked ring to generate multiple clock phases using constant step sizes; and the phase blender blends the multiple clock phases to generate blended clock phases.

In Example 7, the subject matter of Examples 5-6 includes, wherein: the blending buffers provide a blending range enabling the values of the blender delay to span at least 1.5 UIs.

In Example 8, the subject matter of Examples 1-7 includes, wherein: the CDR loop further comprises a CDR circuit configured to control the PI to maintain a lock of the sampling clock signal on the loopback signal; and the CDR loop causes the PI phase code to dither by 4 or 5 codes when locked.

In Example 9, the subject matter of Examples 1-8 includes, wherein: the operating of the CDR loop in the loopback mode comprises: routing a transmitter built-in self-test data signal through a transmitter serializer and a transmitter driver to generate the loopback signal.

In Example 10, the subject matter of Example 9 includes, wherein: the operating of the CDR loop in the loopback mode further comprises: providing the loopback signal to a receive path comprising a continuous time linear equalizer (CTLE), an analog-to-digital converter (ADC), and a feed-forward equalizer (FFE).

Example 11 is a system for performing loopback self-testing of a phase interpolator (PI) in a serial link system, the system comprising: a clock and data recovery (CDR) loop to operate in a loopback mode until a sampling clock signal locks to a first valid lock point in a first unit interval (UI) of a loopback signal, the CDR loop comprising: the PI; a phase blender for blending weights of multiple clock signals phase offset from each other to apply a blender delay to the sampling clock signal; and a memory for storing a PI phase code corresponding to a phase adjustment of the locked sampling clock signal; a built-in self-test (BIST) circuit checking for bit errors of the loopback signal as sampled by the locked sampling clock signal; and control logic to perform operations comprising: sweeping the blender delay by repeating one or more times: adjusting the blender delay of the phase blender to phase shift the sampling clock signal; operating the CDR loop to lock the sampling clock signal; and checking for bit errors, such that values of the blender delay span at least one UI of phase; and sweeping across one or more further UIs by repeating, for each further UT: adjusting the PI phase code to target a further valid lock point in the further UI; and sweeping the blender delay.

In Example 12, the subject matter of Example 11 includes, wherein: the blender control circuit adjusts the blender delay by a blender step spanning a phase that is no greater than a dither range of the CDR loop.

In Example 13, the subject matter of Example 12 includes, the operations further comprising: prior to operating the CDR loop in the loopback mode, adjusting a bandwidth of the CDR loop to adjust the dither range.

In Example 14, the subject matter of Examples 12-13 includes, wherein: the one or more further UIs consists of three further UIs, such that the BIST circuit checks for bit errors when locked to four valid lock points over four UIs.

In Example 15, the subject matter of Examples 11-14 includes, wherein: the blending of the weights of the multiple clock signals comprises: blending outputs of two or more blending buffers to weight multiple input phases to create an output phase that is a combination of the input phases, the blender delay being based on the output phase.

In Example 16, the subject matter of Examples 11-15 includes, wherein: the PI comprises an injection-locked ring to generate multiple clock phases using constant step sizes; and the phase blender blends the multiple clock phases to generate blended clock phases.

In Example 17, the subject matter of Examples 11-16 includes, wherein: the CDR loop further comprises a CDR circuit configured to control the PI to maintain a lock of the sampling clock signal on the loopback signal; and the CDR loop causes the PI phase code to dither by 4 or 5 codes when locked.

In Example 18, the subject matter of Examples 11-17 includes, wherein: the operating of the CDR loop in the loopback mode comprises: routing a transmitter built-in self-test data signal through a transmitter serializer and a transmitter driver to generate the loopback signal.

In Example 19, the subject matter of Example 18 includes, a receive path comprising: a continuous time linear equalizer (CTLE); an analog-to-digital converter (ADC); and a feed-forward equalizer (FFE); wherein: the operating of the CDR loop in the loopback mode further comprises: providing the loopback signal to the receive path.

Example 20 is a system for performing loopback self-testing of a phase interpolator (PI) in a serial link system, the system comprising: a phase-locked loop for generating a sampling clock signal; a clock and data recovery (CDR) loop to operate in a loopback mode until a sampling clock signal locks to a first valid lock point in a first unit interval (UI) of a loopback signal, the CDR loop comprising: an analog-to-digital converter (ADC); a feed-forward equalizer (FFE); the PI; a phase blender for blending weights of multiple clock signals phase offset from each other to apply a blender delay to the sampling clock signal; and a memory for storing a PI phase code corresponding to a phase adjustment of the locked sampling clock signal; a built-in self-test (BIST) circuit checking for bit errors of the loopback signal as sampled by the locked sampling clock signal; a transmitter path comprising a transmitter serializer and a transmitter driver; a continuous time linear equalizer (CTLE) for receiving the loopback signal from the transmitter path and equalizing the received loopback signal; and control logic operable to perform operations comprising: sweeping the blender delay by repeating one or more times: adjusting the blender delay of the phase blender to phase shift the sampling clock signal; operating the CDR loop to lock the sampling clock signal; and checking for bit errors, such that values of the blender delay span at least one UI of phase; and sweeping across one or more further UIs by repeating, for each further UT: adjusting the PI phase code to target a further valid lock point in the further UI; and sweeping the blender delay.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

"Component" refers, for example, to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various examples, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application-specific integrated circuit (ASIC). A hardware component may also include programmable logic or circuitry that is temporarily configured by software to perform certain operations. For example, a hardware component may include software executed by a general-purpose processor or other programmable processors. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In examples in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some examples, the processors or processor-implemented components may be located in a single geographic location (e.g., within a home environment, an office environment, or a server farm). In other examples, the processors or processor-implemented components may be distributed across a number of geographic locations.

"Computer-readable storage medium" refers, for example, to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

"Machine storage medium" refers, for example, to a single or multiple storage devices and media (e.g., a centralized or distributed database, and associated caches and servers) that store executable instructions, routines and data. The term shall accordingly be taken to include, but not be limited to, solid-state memories, and optical and magnetic media, including memory internal or external to processors. Specific examples of machine-storage media, computer-storage media and device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Non-transitory computer-readable storage medium" refers, for example, to a tangible medium that is capable of storing, encoding, or carrying the instructions for execution by a machine.

"Signal medium" refers, for example, to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

What is claimed is:

1. A method for loopback self-testing of a phase interpolator (PI) in a serial link system, the method comprising:
operating a clock and data recovery (CDR) loop in a loopback mode until a sampling clock signal locks to a first valid lock point in a first unit interval (UI) of a loopback signal, the CDR loop comprising:
the PI; and
a phase blender for blending weights of multiple clock signals phase offset from each other to apply a blender delay to the sampling clock signal;
storing a PI phase code corresponding to a phase adjustment of the locked sampling clock signal;
checking for bit errors of the loopback signal as sampled by the locked sampling clock signal;
sweeping the blender delay by repeating one or more times:
adjusting the blender delay of the phase blender to phase shift the sampling clock signal;
operating the CDR loop to lock the sampling clock signal; and
checking for bit errors,
such that values of the blender delay span at least one UI of phase; and
sweeping across one or more further UIs by repeating, for each further UI:
adjusting the PI phase code to target a further valid lock point in the further UI; and
sweeping the blender delay.

2. The method of claim 1, wherein:
the adjusting of the blender delay comprises adjusting the blender delay by a blender step spanning a phase that is no greater than a dither range of the CDR loop.

3. The method of claim 2, further comprising:
prior to operating the CDR loop in the loopback mode, adjusting a bandwidth of the CDR loop to adjust the dither range.

4. The method of claim 2, wherein:
the one or more further UIs consists of three further UIs, such that the method checks for bit errors when locked to four valid lock points over four UIs.

5. The method of claim 1, wherein:
the blending of the weights of the multiple clock signals comprises:
blending outputs of two or more blending buffers to weight multiple input phases to create an output phase that is a combination of the input phases, the blender delay being based on the output phase.

6. The method of claim 1, wherein:
the PI comprises an injection-locked ring to generate multiple clock phases using constant step sizes; and
the phase blender blends the multiple clock phases to generate blended clock phases.

7. The method of claim 5, wherein:
the blending buffers provide a blending range enabling the values of the blender delay to span at least 1.5 UIs.

8. The method of claim 1, wherein:
the CDR loop further comprises a CDR circuit configured to control the PI to maintain a lock of the sampling clock signal on the loopback signal; and
the CDR loop causes the PI phase code to dither by 4 or 5 codes when locked.

9. The method of claim 1, wherein:
the operating of the CDR loop in the loopback mode comprises:
routing a transmitter built-in self-test data signal through a transmitter serializer and a transmitter driver to generate the loopback signal.

10. The method of claim 9, wherein:
the operating of the CDR loop in the loopback mode further comprises:
providing the loopback signal to a receive path comprising a continuous time linear equalizer (CTLE), an analog-to-digital converter (ADC), and a feed-forward equalizer (FFE).

11. A system for performing loopback self-testing of a phase interpolator (PI) in a serial link system, the system comprising:
a clock and data recovery (CDR) loop to operate in a loopback mode until a sampling clock signal locks to a first valid lock point in a first unit interval (UI) of a loopback signal, the CDR loop comprising:
the PI;
a phase blender for blending weights of multiple clock signals phase offset from each other to apply a blender delay to the sampling clock signal; and
a memory for storing a PI phase code corresponding to a phase adjustment of the locked sampling clock signal;
a built-in self-test (BIST) circuit checking for bit errors of the loopback signal as sampled by the locked sampling clock signal; and
control logic to perform operations comprising:
sweeping the blender delay by repeating one or more times:
adjusting the blender delay of the phase blender to phase shift the sampling clock signal;
operating the CDR loop to lock the sampling clock signal; and
checking for bit errors,
such that values of the blender delay span at least one UI of phase; and
sweeping across one or more further UIs by repeating, for each further UI:
adjusting the PI phase code to target a further valid lock point in the further UI; and
sweeping the blender delay.

12. The system of claim 11, wherein:
the blender control circuit adjusts the blender delay by a blender step spanning a phase that is no greater than a dither range of the CDR loop.

13. The system of claim 12, the operations further comprising:
prior to operating the CDR loop in the loopback mode, adjusting a bandwidth of the CDR loop to adjust the dither range.

14. The system of claim 12, wherein:
the one or more further UIs consists of three further UIs, such that the BIST circuit checks for bit errors when locked to four valid lock points over four UIs.

15. The system of claim 11, wherein:
the blending of the weights of the multiple clock signals comprises:
blending outputs of two or more blending buffers to weight multiple input phases to create an output phase that is a combination of the input phases, the blender delay being based on the output phase.

16. The system of claim 11, wherein:
the PI comprises an injection-locked ring to generate multiple clock phases using constant step sizes; and
the phase blender blends the multiple clock phases to generate blended clock phases.

17. The system of claim 11, wherein:

the CDR loop further comprises a CDR circuit configured to control the PI to maintain a lock of the sampling clock signal on the loopback signal; and the CDR loop causes the PI phase code to dither by 4 or 5 codes when locked.

18. The system of claim 11, wherein:

the operating of the CDR loop in the loopback mode comprises:

routing a transmitter built-in self-test data signal through a transmitter serializer and a transmitter driver to generate the loopback signal.

19. The system of claim 18, further comprising a receive path comprising:

a continuous time linear equalizer (CTLE);

an analog-to-digital converter (ADC); and a feed-forward equalizer (FFE);

wherein:

the operating of the CDR loop in the loopback mode further comprises:

providing the loopback signal to the receive path.

20. A system for performing loopback self-testing of a phase interpolator (PI) in a serial link system, the system comprising:

a phase-locked loop for generating a sampling clock signal;

a clock and data recovery (CDR) loop to operate in a loopback mode until a sampling clock signal locks to a first valid lock point in a first unit interval (UI) of a loopback signal, the CDR loop comprising:

an analog-to-digital converter (ADC);

a feed-forward equalizer (FFE);

the PI;

a phase blender for blending weights of multiple clock signals phase offset from each other to apply a blender delay to the sampling clock signal; and a memory for storing a PI phase code corresponding to a phase adjustment of the locked sampling clock signal;

a built-in self-test (BIST) circuit checking for bit errors of the loopback signal as sampled by the locked sampling clock signal;

a transmitter path comprising a transmitter serializer and a transmitter driver;

a continuous time linear equalizer (CTLE) for receiving the loopback signal from the transmitter path and equalizing the received loopback signal; and control logic operable to perform operations comprising:

sweeping the blender delay by repeating one or more times:

adjusting the blender delay of the phase blender to phase shift the sampling clock signal;

operating the CDR loop to lock the sampling clock signal; and checking for bit errors, such that values of the blender delay span at least one UI of phase; and sweeping across one or more further UIs by repeating, for each further UI:

adjusting the PI phase code to target a further valid lock point in the further UI; and sweeping the blender delay.

* * * * *